United States Patent

Fukuzawa

[11] Patent Number: 5,920,323
[45] Date of Patent: Jul. 6, 1999

[54] DIAGRAM PROCESSING APPARATUS AND METHOD

[75] Inventor: Sanae Fukuzawa, Tokyo, Japan

[73] Assignee: Canon Kabushiki Kaisha, Tokyo, Japan

[21] Appl. No.: 08/597,862

[22] Filed: Feb. 7, 1996

[30] Foreign Application Priority Data

Feb. 9, 1995 [JP] Japan ................................. 7-044778
Apr. 17, 1995 [JP] Japan ................................. 7-090446
Jul. 13, 1995 [JP] Japan ................................. 7-177376

[51] Int. Cl.$^6$ .................................................. G06F 15/00

[52] U.S. Cl. ............................................................ 345/441

[58] Field of Search ........................... 395/135, 131, 395/141, 143, 142; 345/441, 442, 147, 148, 149

[56] References Cited

U.S. PATENT DOCUMENTS 5,208,904  5/1993  Sasaki .................................... 395/143
5,375,194  12/1994  Hori ...................................... 395/133

Primary Examiner—Phu K. Nguyen
Attorney, Agent, or Firm—Fitzpatrick, Cella, Harper & Scinto

[57] ABSTRACT

A method and apparatus for forming run length data in response to commands for drawing a broken lines, and a method for cached pen step data storage is provided. The cached pen step data corresponding to an amount which is deleted such that the pen step data of a designated line width can be stored and the pen step data of the designated line width is cached, thereby efficiently drawing a line of the designated line width. A method for selecting the optimum data format when holding the data on the basis of the height and shape of a segment, thereby allowing the drawing process to be performed at a high speed, is also provided.

28 Claims, 25 Drawing Sheets

TRAPEZOID

RUN LENGTH

DIAGRAM PROCESSING APPARATUS AND METHOD

BACKGROUND OF THE INVENTION

1. Field of the Invention

The invention relates to diagram processing apparatus and method for drawing a diagram.

2. Related Background Art

A conventional printer apparatus uses a drawing method whereby a line (diagram) to be drawn in one page is divided into a line segment (hereinafter, simply referred to as a segment) in which a line from a position (point A shown in FIG. 5) of the largest Y coordinate to a position (point B) at which a drawing direction of the diagram changes (from the Y direction to the −Y direction or from the −Y direction to the Y direction) by 180° for the direction of the portion at the position A or a line from the position A to a position (point C) at which a continuous line is stopped is set to one line, the segment is converted into data of a format called a run length, and the diagram is drawn on the basis of the run length data.

The run length has the X coordinate of a drawing start point and the X coordinate of a drawing end point as a pair of data every scan line. Therefore, run length objects have data of the same size irrespective of the shapes of diagrams so long as heights (differences between the Y coordinates at the top positions and the Y coordinates at the bottom positions) of the target diagrams are equal.

In case of drawing, for example, a diagram as shown in FIG. 5 by using the above conventional drawing method, a continuous line from the start to the end of the drawing is first divided into a segment 1 from the point A to the point B and a segment 2 from the point B to the point C. Each segment is regarded as a closed area consisting of a polygon and a diagram is drawn by fully painting the closed area. The painting of the closed area is performed on the basis of run length data. The run length data is formed every segment. The diagram is drawn in accordance with a procedure such that after the drawing process based on the run length data for the segment was performed, another run length data for the next segment is formed.

According to the above conventional drawing method, however, since the drawing process is once performed for every segment irrespective of a length or shape of the segment, for example, in case of repetitively drawing a segment of a simple shape, a very large number of drawing processes are necessary, so that there is a problem such that a processing speed remarkably deteriorates.

In the conventional drawing library, in order to draw a line of a width of 2 or more, a poly pen corresponding to the line width is formed and pen data is extracted in accordance with the requested line width, thereby drawing the line. The poly pen and its data structure will now be described.

As shown in FIG. 13, according to the poly pen (hereinafter, simply referred to as a pen), a quarter (¼) circle of the same radius as a line width W is divided in accordance with a proper dividing rule to thereby form poly lines and a vector from a certain summit to the adjacent summit is set to a drawing element (hereinafter, referred to as a pen step). The pen corresponding to one line width starts from a horizontal step and ends at a vertical step.

As shown in FIG. 14, each pen step has a slope, a direction from the center for the summit, and coordinates of the summit as data. Each pen step has the data corresponding to a set of those three kinds of values. Entries to all of the step data are sequentially held from the line width "0" to the maximum width.

Further, in correspondence to each line width, an entry to the horizontal pen step and an entry to the vertical pen step are held as a table. By searching the table, the pen step data of a necessary line width is extracted.

As mentioned above, according to the conventional processes of the pen step data, since the pen step data is continuously stored in the pen step table C from the minimum line width to the maximum cache line width, the value of the designated line width directly becomes the entry to an index A of the horizontal pen step and the entry to an index B of the vertical pen step.

The making of the pen step data will now be described.

Since the poly pen data is line symmetric data in which a slope of 45° is set to a boundary, the data is compressed by the following method and held in order to reduce a memory use amount.

That is, now assuming that increase amounts of x and y from a certain step to the next step of the pen step existing in a range from the horizontal direction to 45° (hereinafter, such a pen step is referred to as an up-step) are set to dx and dy, respectively, increase amounts of the pen step existing in a range from 45° to the vertical direction (hereinafter, such a pen step is referred to as a down-step) are the amounts in which dx and dy of the up-steps existing at the position where they are symmetrical with respect to a line are exchanged. By making (dx, dy) (hereinafter, referred to as a step relation) correspond to each pen step as a set of data, the pen step data can be formed from those values.

For one step relation, two cases of the up-step and down-step are considered as a slope of the pen step. Therefore, as shown in FIG. 15, as data tables, the following three tables are prepared, (1) Step relation table (hereinafter, referred to as RelTable)

(2) Slope table in case of the up-step (hereinafter, referred to as an UpSlopeTable)

(3) Slope table in case of the down-step (hereinafter, referred to as DownSlopeTable)

thereby enabling those tables to be searched by the same entry.

Further, by making the following tables, (4) Table in which those entries are made correspond to the up-steps of all of the line widths (hereinafter, referred to as a StepTable)

(5) Table shown in FIG. 15 in which the line width and StepTable are made correspond (hereinafter, referred to as a PenTable)

the poly pen data is searched from the line width and the pen step data can be formed.

Processes of the data which are executed from the generation of a request to designate a line width to the drawing of a pen will now be described with reference to a flowchart shown in FIG. 16.

FIG. 16 is a flowchart showing an example of a processing procedure of data which is executed from the generation of the line width designation request to the drawing of the pen in a conventional output apparatus. Reference numerals (1) to (10) denote processing steps.

A check is made to see if the corresponding pen has been cached after the line width was designated (1). If YES, step (10) follows and the pen step data is searched (10). The processing routine advances to step (7).

If NO in the judgment in step (1), a check is made to see if the compressed data of the corresponding pen has been held or not (2). If YES, step (9) follows. The compressed data is searched and the processing routine is returned to step (5).

If NO in the judgment in step (2), poly pen data is formed (3) and converted into compressed data (4) and is developed into pen step data (5). The pen is cached into an RAM area (6). The pen is selected (7). A drawing process is executed (8).

The holding of the pen step data and compressed data will now be described hereinbelow.

In the conventional technique, after the poly pen data corresponding to all of the line widths from the minimum line width (0) to the maximum line width was formed, the data is compressed and stored into a file and is held into an ROM area built in the printer in advance. Further, the compressed data of the line width which is considered to be frequently used at the time of the initialization of the program is developed in advance and the pen step data is formed and held as data table into the RAM area (such data is referred to as a cache pen).

Thus, as shown in FIG. 17, when a line width designation command is generated during the execution of a program, if the requested width has already been developed as a cache pen, the entry is returned as it is. When the width is not cached, the compressed data stored in the ROM is read out and developed and the pen step data is formed and used.

As mentioned above, by storing the compressed data into the ROM, the memory use amount in the RAM area is reduced and the pen step data which is frequently used is cached into the RAM area, thereby enabling the line width to be efficiently selected.

As mentioned above, in order to use the poly pen corresponding to a certain line width, it is necessary to pass through a converting path comprising a poly pen data forming process (first process), a converting process to the compressed data (second process), and a developing process to the pen step data (third process). Although the processing procedure can be started from any data format, if it is started from the first process of making the poly pen data, an area to previously hold the data is unnecessary and the memory use amount is minimum. However, there is a problem such that it takes a long time to form the poly pen data. If the pen step data in the third process is formed in advance, although the making time is shortest, there is a problem such that a large capacity of area to hold the data is needed.

Since the number of compressed data or cache pens which can be held in advance depends on the RAM memory capacity of a printer, it is necessary to use a structure which can be switched in accordance with the situation by a method such that in accordance with the memory that is installed, when the memory capacity is small, ranges of the compressed data and cache pens which are held are reduced and a data forming range is dynamically increased in response to the line width designation request, and in the case where the memory capacity is sufficient, the ranges of the compressed data and cache pens which are held are increased and the data forming range is dynamically reduced in response to the line width designation request, or the like.

According to the above conventional method, however, the pen to be previously cached into the pen step table is limited to the continuous data from the minimum line width to the maximum cache line width and only one pen step data which is newly formed from the compressed data or poly pen data is also cached.

Therefore, when the memory capacity of the RAM installed is small, if a predetermined amount of cache pens is possessed, there is a possibility such that the pen of a large width cannot be developed. It is necessary that the number of cache pens and the number of caching times of the create pens can be varied.

Hitherto, when a line to be drawn in one page has a width, the line is divided into lines as shown in FIG. 26 and each line is regarded as a polygon and is held as a data structure called a run length which is used for painting the closed area.

The run length holds the X coordinate of the drawing start point and the X coordinate of the drawing end point as a pair of data every scan line. Therefore, the run length objects have the same amount of data irrespective of the shape of the diagrams so long as the heights are equal.

In case of drawing each line, the run length object corresponding to the line data is formed and the line is drawn.

According to the conventional method, however, when the number of scan lines increases due to a high resolution of a printer, an enlargement in paper size, or the like, a memory of a large capacity is necessary at the time of the drawing process in association with an increase in data amount per page and data has to be formed with respect to all of the scan lines, so that a problem of the reduction of a processing speed occurs.

As a data format for a closed diagram, there is a format called a trapezoid other than the run length.

Although the trapezoid has the right and left drawing positions for one scan line as data in a manner similar to the run length, it doesn't have the X coordinates of the right and left positions with respect to all of the scan lines as in the run length. However, an offset (difference of the X coordinates) from one-preceding point, a slope (slope of an edge) to the next point, and the number of scan lines between those two points are possessed as a set of data every right and left points of the diagram. The X coordinate of each scan line is calculated and obtained from the set of data.

As mentioned above, until the slope of an outline changes, even if the number of scan lines increases, the data amount doesn't increase. Therefore, the trapezoid is a data format that is particularly effective with respect to a diagram in which a change in slope is relatively small, namely, the number of straight lines is large. When developing a bit map by a hardware, there is also an advantage such that by inputting the data in the trapezoid format, the developing process can be performed earlier because of the characteristics of the hardware. Therefore, when the line having a width is regarded as a polygon, there is also a case where by possessing the data as a trapezoid rather than the run length, it is advantageous under certain conditions. According to the trapezoid, as the number of changes of the slope is small, the number of dividing times decreases irrespective of the size of diagram and the processes can be more efficiently performed. Therefore, in case of a diagram whose slope frequently changes, a superiority of the processing efficiency is not so higher as compared with the case of the run length. Thus, a higher efficiency is derived by processing a line edge portion of a special shape, a joint portion of segments, or the like by run length instead of trapezoid.

In order to process such line edge or joint portion by run length and to process a portion having a predetermined slope by trapezoid, the entire line constructed as one run length needs to be divided into different objects of the run length and trapezoid. As the number of objects increases, the processing efficiency also deteriorates. Therefore, in the case where a height of portion to which the trapezoid process is performed is not so high, the advantage due to the execution of the trapezoid process is set off by a disadvantage such that the number of objects increases, so that the trapezoid process is effective in the case where the height of segment is relatively high.

SUMMARY OF THE INVENTION

The invention is made to solve the above problems and it is an object of the invention to provide a segment drawing method in which even in case of drawing a number of lines of simple shapes, a drawing process can be efficiently executed by the number of processes smaller than the conventional one and also to provide an output apparatus using the segment drawing method.

To accomplish the above object, according to the diagram processing method of the invention, there is provided a segment drawing method whereby a diagram to be drawn in a predetermined area is recognized on a segment unit basis and run length data is formed from the segment and the segment is drawn on the basis of the run length data, comprising the steps of:

discriminating a final line edge shape of the current segment; temporarily reading out a next command when it is judged that the final line edge shape is a predetermined shape; predicting a shape of the next segment on the basis of the next command;

discriminating whether the current segment and the next segment exist on a same scan line or not on the basis of the predicted shape of the next segment; and performing drawing processes of the current segment and the next segment in a lump when it is judged that the current segment and the next segment don't exist on the same scan line.

To accomplish the above object, according to the present invention, there is a diagram processing apparatus of a printer apparatus having drawing means for recognizing a diagram to be drawn in a predetermined area on a segment unit basis, forming run length data from the segment, and drawing the segment on the basis of the run length data and output means for outputting the segment drawn by the drawing means, comprising: final line edge discriminating means for discriminating a final line edge shape of the current segment; segment predicting means for temporarily reading out the next command and predicting a shape of the next segment on the basis of the next command when it is judged by the final line edge discriminating means that the final line edge shape is a predetermined shape; and line discriminating means for discriminating whether the current segment and the next segment exist on a same scan line or not on the basis of the shape of the next segment which was predicted by the segment predicting means, wherein when it is judged by the line discriminating means that the current segment and the next segment don't exist on the same scan line, the drawing means executes the drawing processes of the current segment and the next segment in a lump.

According to the invention, when the final line edge shape of the current segment is discriminated and it is judged that the final line edge shape is the predetermined shape, the next command is temporarily read out. On the basis of the next command, the shape of the next segment is predicted. On the basis of the predicted shape of the next segment, a check is made to see if the current segment and the next segment exist on the same scan line. When it is judged that the current segment and the next segment don't exist on the same scan line, the drawing processes of the current segment and the next segment are executed in a lump.

The invention is made to solve the above problems and it is another object of the invention to provide diagram processing apparatus and method, in which by managing an area to store a cache pen as an area to store a create pen of a line width designated, a range where the cache pen is held in advance and a range where the create pen to be dynamically formed in accordance with the designated line width is cached are freely changed and a line of the designated line width can be efficiently drawn.

To accomplish the above object, according to the invention, there is provided a diagram processing apparatus comprising: memory means for forming pen data constructed by a set of a slope based on a predetermined number of poly lines which are obtained by line-symmetrically dividing an arc indicating a predetermined line width and having the same radius as the line width, a direction from the center of the arc for a summit, and coordinates of the summit and for storing pen step data obtained by adding predetermined management information to the pen data formed; a pen cache memory for reading out the pen step data of the predetermined line width stored in the memory means and for temporarily storing as a cache pen; designating means for designating a desired line width; forming means for forming create pen data constructed by a set of a slope based on a predetermined number of poly lines which are obtained by line-symmetrically dividing an arc having the same radius as the line width designated by the designating means, a direction from the center of the arc for a summit, and coordinates of the summit; discriminating means for discriminating whether the cache pen of the line width designated by the designating means has been cached into the pen cache memory or not; and pen cache memory managing means for clearing the pen step data which has already been stored in the pen cache memory and for storing the create pen data in the case where it is judged by the discriminating means that the cache pen of the designated line width is not cached in the pen cache memory.

To accomplish the above object, according to the invention, the pen cache memory managing means clears the pen step data which has already been stored in the pen cache memory and stores the create pen data while updating predetermined management information which has already been stored.

To accomplish the above object, according to the invention, there is provided a diagram drawing processing method of an output apparatus having memory means for forming pen data constructed by a set of a slope based on a predetermined number of poly lines which are obtained by line-symmetrically dividing an arc indicating a predetermined line width and having the same radius as the line width, a direction from the center of the arc for a summit, and coordinates of the summit and for storing pen step data obtained by adding predetermined management information to the pen data formed; a pen cache memory for reading out the pen step data of the predetermined line width stored in the memory means and for temporarily storing as a cache pen; designating means for designating a desired line width, wherein the diagram drawing processing method comprises: a forming step of forming create pen data constructed by a set of a slope based on a predetermined number of poly lines which are obtained by line-symmetrically dividing an arc having the same radius as the line width designated by the designating means, a direction from the center for a summit, and coordinates of the summit; a discriminating step of discriminating whether a cache pen of the line width designated by the designating means has been cached in the pen cache memory or not; a clearing step of clearing the pen step data which has already been stored in the pen cache memory and keeping an area for registering the create pen data; a registering step of registering the create pen data into the pen cache memory; and an updating step of updating the predetermined management information in the pen cache memory.

To accomplish the above objects, the invention has display means for displaying the pen step data which was cached into the pen cache memory.

To accomplish the above objects, the invention has printing means for printing the pen step data which was cached into the pen cache memory.

To accomplish the above objects, the invention has display means for displaying the pen step data which was cached into the pen cache memory.

To accomplish the above objects, the invention has printing means for printing the pen step data which was cached into the pen cache memory.

According to the invention with the above construction, when the discriminating means for discriminating whether the cache pen having the line width designated by the designating means has been cached in the pen cache memory or not judges that the cache pen of the designated line width is not cached in the pen cache memory, the pen cache memory managing means clears the pen step data which has already been stored in the pen cache memory and stores the create pen data and certainly caches a new create pen into the pen cache memory area, thereby enabling the line of the designated line width to be drawn.

According to the invention with the above construction, the pen cache memory managing means clears the pen step data which has already been stored in the pen cache memory and stores the create pen data while updating the predetermined management information which has already been stored. Even if the contents in the pen cache memory are rewritten, the pen step data of the designated line width can be read out from the pen cache memory.

According to the invention with the above construction, a check is made to see if the cache pen of the line width designated by the designating means has been cached in the pen cache memory. The pen step data which has already been stored in the pen cache memory is cleared and the area to register the create pen data is held. The create pen data is registered into the pen cache memory. The predetermined management information in the pen cache memory is updated. The new create pen is certainly cached into the pen cache memory area, thereby enabling drawing process of the line of the designated line width to be programmably executed.

According to the invention with the above construction, the new create pen is certainly cached into the pen cache memory area and the line of the designated line width is drawn, thereby enabling the display means to execute the line drawing display by using the create pen drawn.

According to the invention with the above construction, the new create pen is certainly cached into the pen cache memory area and the line of the designated line width is drawn, thereby enabling the printing means to execute the line drawing printing by using the create pen drawn.

According to the invention with the above construction, the new create pen is certainly cached into the pen cache memory area and the line of the designated line width is drawn, thereby automatizing a process for allowing the display means to execute the line drawing display by using the create pen drawn.

According to the invention with the above construction, the new create pen is certainly cached into the pen cache memory area and the line of the designated line width is drawn, thereby automatizing a process for allowing the printing means to execute the line drawing printing by using the create pen drawn.

Further another object of the invention is to provide diagram processing apparatus and method, in which the drawing process can be performed at a high speed by a small data amount.

To accomplish the above object, according to the invention, there is provided a diagram processing apparatus for holding diagram data by a run length format and a trapezoid format and drawing bit map data indicative of a diagram on the basis of the diagram data, comprising: input means for inputting diagram data; discriminating means for discriminating whether the diagram data inputted by the input means satisfies a predetermined condition or not; and means for holding the diagram data by the trapezoid format when it is judged by the discriminating means that the inputted diagram data satisfies the predetermined condition.

To accomplish the above object, according to the invention, there is provided a diagram processing method of holding diagram data by a run length format and a trapezoid format and drawing bit map data indicative of a diagram on the basis of the diagram data, comprising: an input step of inputting diagram data; a discriminating step of discriminating whether the diagram data inputted by the input means satisfies a predetermined condition or not; and a step of holding the diagram data by the trapezoid format when it is judged by the discriminating step that the inputted diagram data satisfies the predetermined condition.

DETAILED DESCRIPTION OF THE PREFERRED EMBODIMENTS

Embodiments of the invention will now be described hereinbelow with reference to the drawings.

[Embodiment 1]

Figure 1:
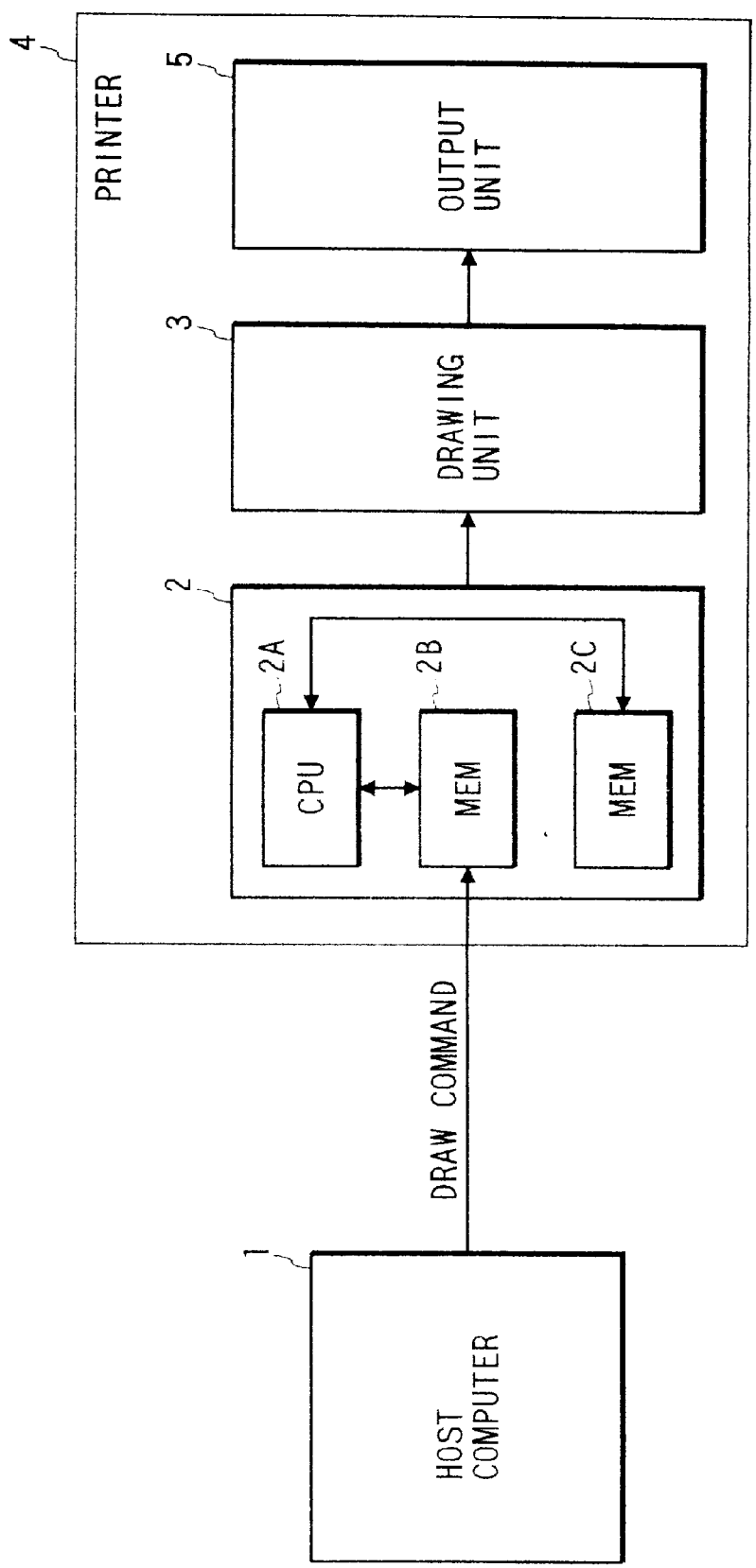
FIG. 1 is a block diagram showing a schematic construction of a printer apparatus which can realize a segment drawing method according to the first embodiment of the invention.

FIG. 1 is a block diagram showing a schematic construction of a printer system as an output apparatus which can execute a segment drawing method according to an embodiment. In the diagram, the printer system is constructed by a host computer 1 and a printer 4. The host computer is used for the operator to input a draw command or the like of a diagram. The printer 4 is constructed by: an analyzing unit 2 which has a memory of a capacity of at least one page and analyzes and recognizes the diagram, as data, to which the draw command was generated; a drawing unit 3 for actually performing a drawing process on the basis of the recognized data; and an output unit 5 for printing and outputting image data which was drawn by the drawing unit 3. The analyzing unit 2 has therein: a central processing unit (CPU) 2a for executing a control of the operation of the printer 4, an analysis of the diagram, and the like; a memory 2b for temporarily storing a command such as a draw command or the like, an instruction, and the like which are sent from the host computer 1; and a memory 2c for storing a program or the like to execute the processes such as control of the printer, analysis of the diagram, and the like which are executed by the CPU 2a.

In the above construction, when the operator inputs an initial point and a final point of a desired diagram and a kind of diagram to the host computer 1, a draw command is generated from the host computer 1 to the printer 4. The draw command comprises commands to designate a drawing start position and a drawing end position of the diagram, the kind of diagram, and the like. In the analyzing unit 2 of the printer 4, run length data is formed while successively analyzing the draw command, and the drawing process is sequentially executed in accordance with the order from the initial line edge shape, outline, and final line edge.

Figure 2:
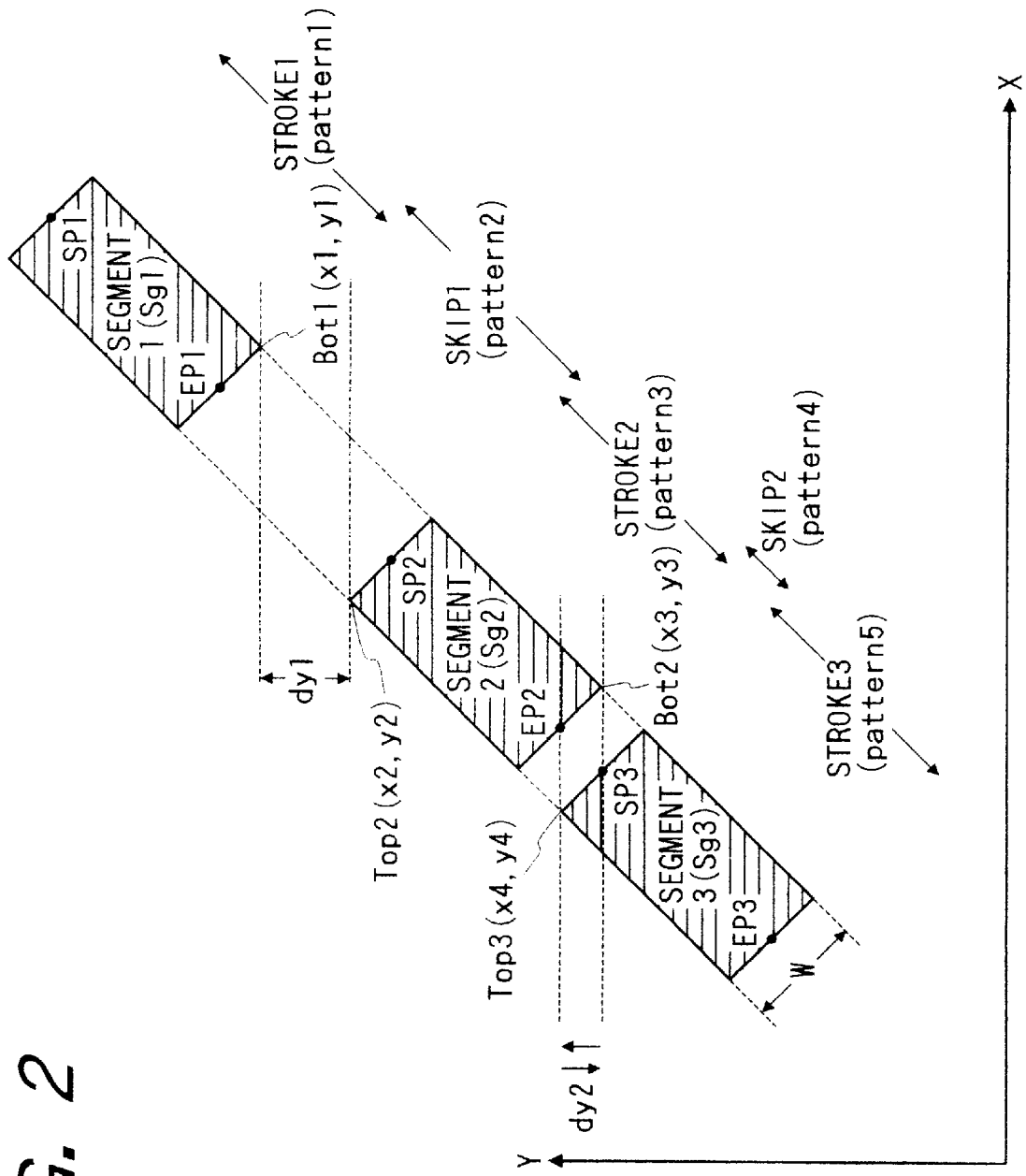
FIG. 2 is a diagram showing an example of a diagram which is drawn in the embodiment.

FIG. 2 is a diagram showing an example of the diagram to be drawn in the embodiment. Hereinafter, the vertical direction of the drawings assumes the Y direction and the lateral direction assumes the X direction. The case of drawing a broken line having a line width W and patterns 1 to 5 will now be described.

In the diagram, black patterns (strokes 1 to 3) are portions which are recognized as a segment Sg1, a segment Sg2, and a segment Sg3. Blank portions (white patterns) among the segments are recognized as a skip 1 and a skip 2, respectively. A drawing start position SP1 of the broken line indicates a middle point of the initial line edge of the segment Sg1 and corresponds to an initial point of the diagram which is designated by the operator. A drawing end position EP3 indicates a middle point of the final line edge of the segment Sg3 and corresponds to a final point of the diagram which is designated by the operator.

When such a diagram is drawn, the draw commands which are transmitted from the host computer to the printer 4 are sequentially transmitted in accordance with the order of the pattern shown in FIG. 2, namely, "stroke 1 draw command"→"skip 1 draw command"→"stroke 2 draw command"→"skip 2 draw command"→"stroke 3 draw command". The transmitted commands are once stored into the memory 2b in the analyzing unit 2 and are sequentially executed by the CPU 2a.

Figure 3:
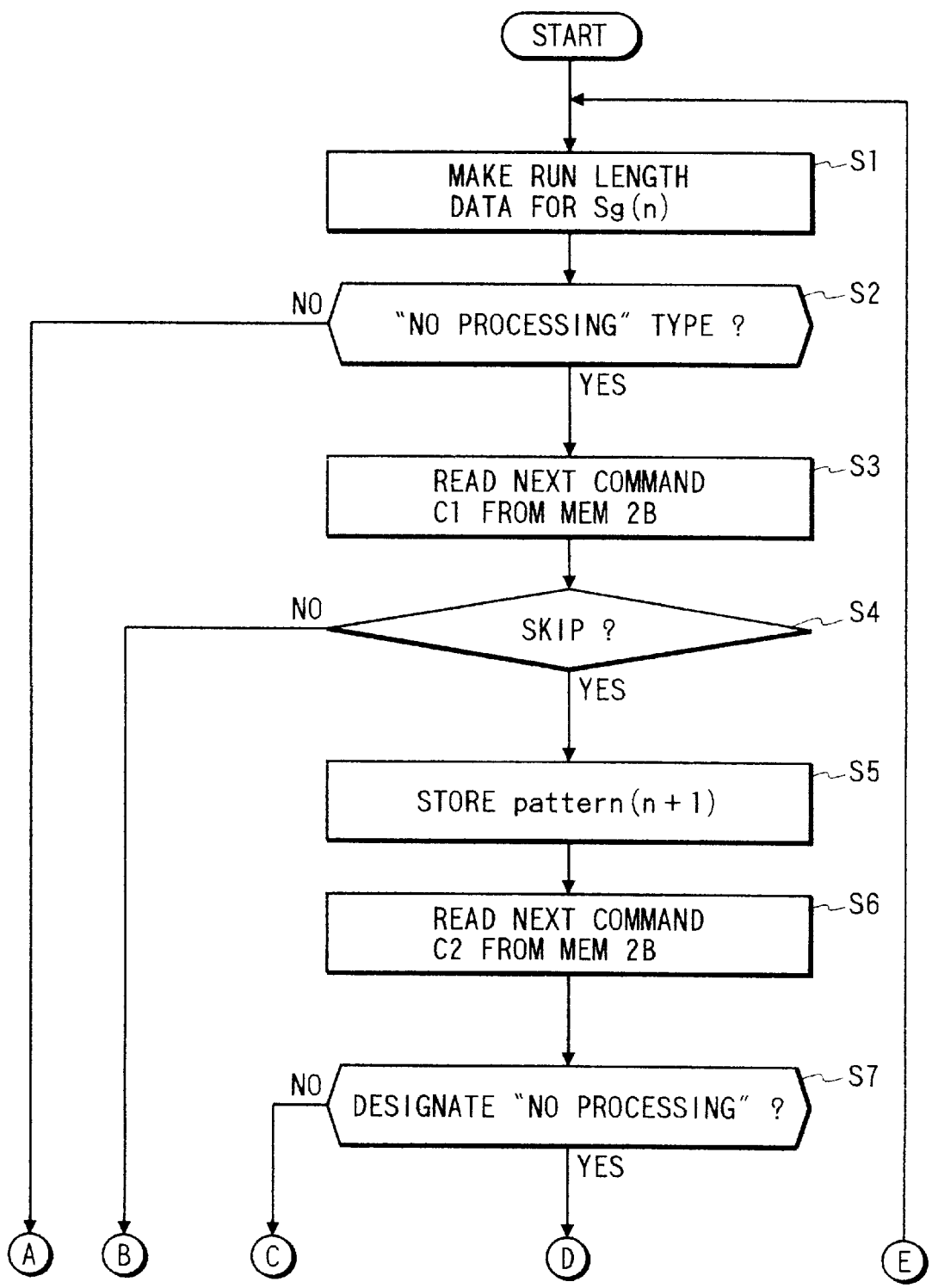
FIG. 3 is a flowchart showing a segment drawing procedure.
Figure 4:
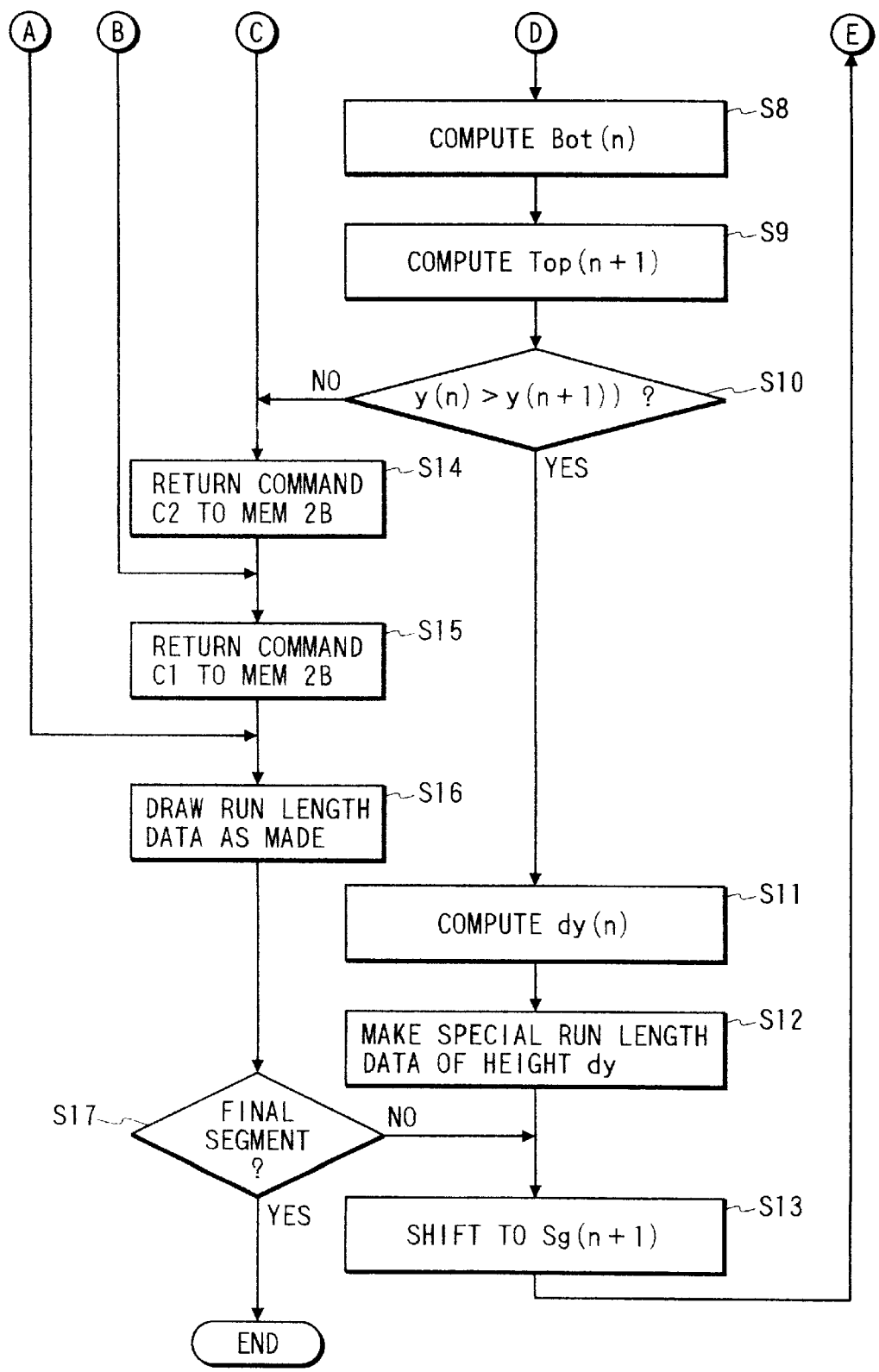
FIG. 4 is a flowchart showing a segment drawing procedure.
Figure 5:
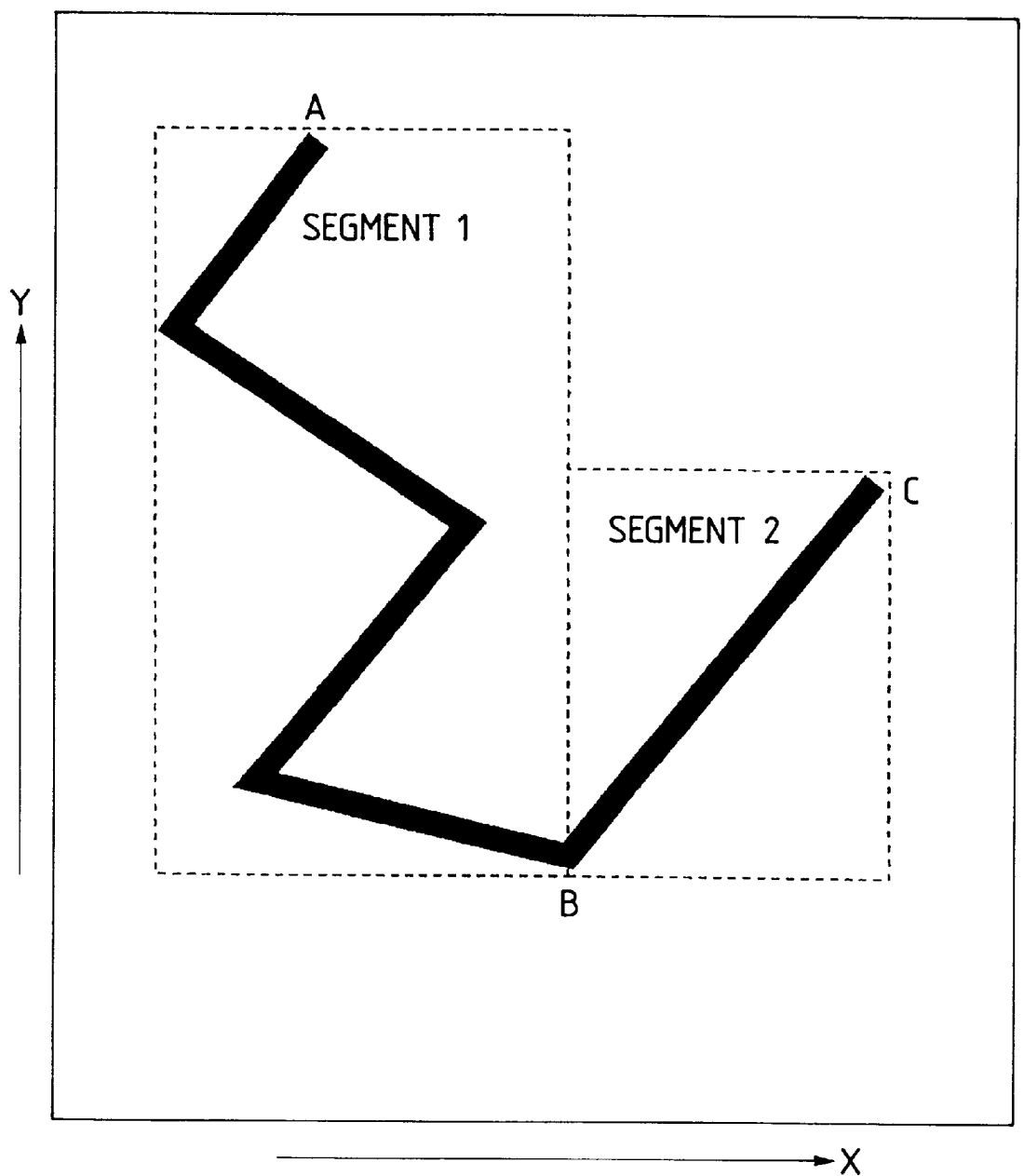
FIG. 5 is a diagram for explaining segments to recognize a diagram to be drawn in one page.

FIGS. 3 and 4 are flowcharts showing a segment drawing processing procedure of the diagram by the printer according to the embodiment. A case of drawing the broken line shown in FIG. 2 will now be described as an example. A program to execute the processing procedure shown in the flowcharts has been stored in the memory 2c shown in FIG. 1 and is executed by the CPU 2a.

When the draw command shown by the broken line is transmitted from the host computer 1 to the printer 4, the run length data of the segment Sg1 is formed by the CPU 2a (step S1).

After completion of the making of the run length data up to the final line end of the segment Sg1, a check is made to see if the shape of the final line edge of the segment processed in step S1 is of the "no processing" type in which the line edge process to designate the final line edge to the designated shape is not performed (step S2). When it is judged that the shape is not the "no processing" type, the relevant segment is drawn as one object by an ordinary drawing method. Therefore, step S16 follows. When it is judged that the final line edge of the segment Sg1 is of the "no processing" type formed in the shape shown in FIG. 2, a next command C1 is temporarily read out from the memory 2b (step S3) and a check is made to see if the command C1 is a skip command (step S4).

When it is judged that the command C1 is not the skip command, the processing routine advances to step S15, which will be explained hereinlater. In step S15, the command C1 is returned into the memory 2b. Run length objects formed so far are drawn (step S16).

When it is judged that the command C1 is the skip command, a displacement (namely, length of pattern 2) of the skip included in the command C1 is stored into the memory 2c (step S5). A next command C2 is temporarily read out (step S6).

Subsequently, a check is made to see if the command C2 which was temporarily read out is a command to designate the initial line shape of the next segment Sg2 to the "no processing" type (step S7). If NO, step S14 follows. In step S14, the command C2 read out in step S6 is returned into the memory 2b. Further in step S15, the command C1 read out in step S3 is returned into the memory 2b. When it is judged that the command C2 designates the "no processing" type, a bottom position Bot1 (x1, y1) of the segment Sg1 is calculated on the basis of an end position EP1 as a middle point of the final line end of the segment Sg1 and the line width W (step S8). A drawing start position SP2 of the segment Sg2 is calculated on the basis of the length of pattern 2 stored in step S5 and the start position SP1 and end position EP1 of the segment Sg1. Further, a top position Top2 (x2, y2) of the segment Sg2 is calculated on the basis of the start position SP2 and line width W (step S9).

When Bot1 and Top2 are calculated, by comparing the Y coordinates y1 and y2, a check is made to see if the segments Sg1 and Sg2 overlap the same scan line (step S10). Specifically speaking, as shown in FIG. 2, when the value of y2 is smaller than the value of y1, the segments Sg1 and Sg2 don't overlap the same scan, so that both of the segments can be combined into the same run length data. Therefore, the number (dy) of scan lines between the two segments is calculated from the values of y1 and y2 (step S11). Special run length data of a height dy is formed between y1-y2 (step S12). The run length data which is formed here is [(left run)>(right run)]. Specifically speaking, the maximum value of the coordinate system is set into the left run and the minimum value of the coordinate system is set into the right run. By forming such special run length data, the pattern of the segment Sg1 and the pattern of the skip 1 are continuously converted into the run length data.

After completion of the making of the run length data of the portion of the skip 1, the processing routine is returned to step S1 mentioned above in order to further continuously convert the next segment Sg2 into the run length data (step S13).

After the run length data of the segment Sg2 was formed in step S1, the processes in steps S3 to S7 are executed. In steps S8 and S9, a bottom position Bot (x3, y3) of the segment Sg2 and a top position Top (x4, y4) of the segment Sg3 are calculated. In step S10, values of y3 and y4 are compared. In this instance, since y3<y4 as will be obvious from FIG. 2, it is judged that the segments Sg2 and Sg3 overlap the same scan line, so that these two segments cannot be combined into one run length object. Therefore, the commands C1 and C2 read out in steps S3 and S6 are returned into the memory 2b (steps S14, S15). The run length objects (stroke 1+skip 1+stroke 2) formed so far are drawn (step S16). At this time, since the run length data corresponding to the strokes 1 and 2 is the normal data such as [(left run)<(right run)], it is actually drawn. However, since the portion corresponding to skip 1 is the abnormal data such as [(left run)>(right run)], this data is skipped in the drawing unit 3 and is not actually drawn.

After completion of the drawing, a check is made to see if the segment drawn in step S16 is the final segment (step S17). Since the drawing of the segment Sg3 is not yet finished in this case, the processes after step S1 are again executed. In step S1, since the processing routine is returned to the time of the end of the making of the data of the segment Sg2, the ordinary processing operation is executed. After the scan line was shifted through the skip 2 portion, the run length data of the segment Sg3 is formed. Since the draw command of the broken line is finished in the segment Sg3, the answer in step S4 is NO. Therefore, the processing routine advances to step S15 and the command C1 is returned into the memory 2b. In step S16, the segment Sg3 is drawn. In step S17, it is judged that the segment is the final segment, so that the drawing process is finished.

The image data which was drawn is printed and outputted by the output unit 5.

According to the embodiment as described above, the next command of the segment which is at present being processed is temporarily extracted, the shape of the next segment is predicted on the basis of the contents of the next command, and whether it can be handled as a same run length or not is judged, so that a plurality of segments can be combined into one run length and can be drawn. Thus, although hitherto one segment was regarded as one run length object and the drawing process had to be executed every segment, a plurality of segments can be drawn by one process. Therefore, in the case such that a number of segments of simple shapes such as broken lines or the like are drawn, the drawing process can be more efficiently performed.

Although the embodiment has been described with respect to the example in which the printer was used as an output apparatus, the invention can be also applied to a display apparatus such as a CRT apparatus or the like having a frame memory.

According to the embodiment as described above, in the segment drawing method whereby the diagram to be drawn in a predetermined area is recognized on a segment unit basis and the run length data is formed from the segment and the segment is drawn on the basis of the run length data, the final line edge shape of the current segment is discriminated and when it is judged that the final line edge shape is the predetermined shape, the next command is temporarily read out. On the basis of the next command, the shape of the next segment is predicted. On the basis of the predicted shape of the next segment, a check is made to see if the current segment and the next segment exist on the same scan line. When it is judged that the current segment and the next segment don't exist on the same scan line, the drawing processes of the current segment and the next segment are executed in a lump. Therefore, a plurality of segments can be drawn by one process. In the case such that a number of segments of simple shapes such as broken lines or the like are drawn, an effect such that the drawing process can be efficiently executed at a higher speed is obtained.

According to the embodiment, there is provided the printer apparatus having the drawing means for recognizing a diagram to be drawn in a predetermined area on a segment unit basis, forming run length data from the segment, and drawing the segment on the basis of the run length data and output means for outputting the segment drawn by the drawing means, comprising: the final line edge discriminating means for discriminating the final line edge shape of the current segment; the segment predicting means for temporarily reading out the next command and predicting the shape of the next segment on the basis of the next command when it is judged by the final line edge discriminating means that the final line edge shape is the predetermined shape; and the line discriminating means for discriminating whether the current segment and the next segment exist on the same scan line on the basis of the shape of the next segment predicted by the segment predicting means, wherein when it is judged by the line discriminating means that the current segment and the next segment don't exist on the same scan line, the drawing means executes the drawing processes of the current segment and the next segment in a lump. Therefore, a plurality of segments can be drawn by one process. In the case where a number of segments of simple shapes such as broken lines or the like are drawn, an effect such that the drawing process can be efficiently executed at a higher speed is obtained.

[Embodiment 2]

Figure 6:
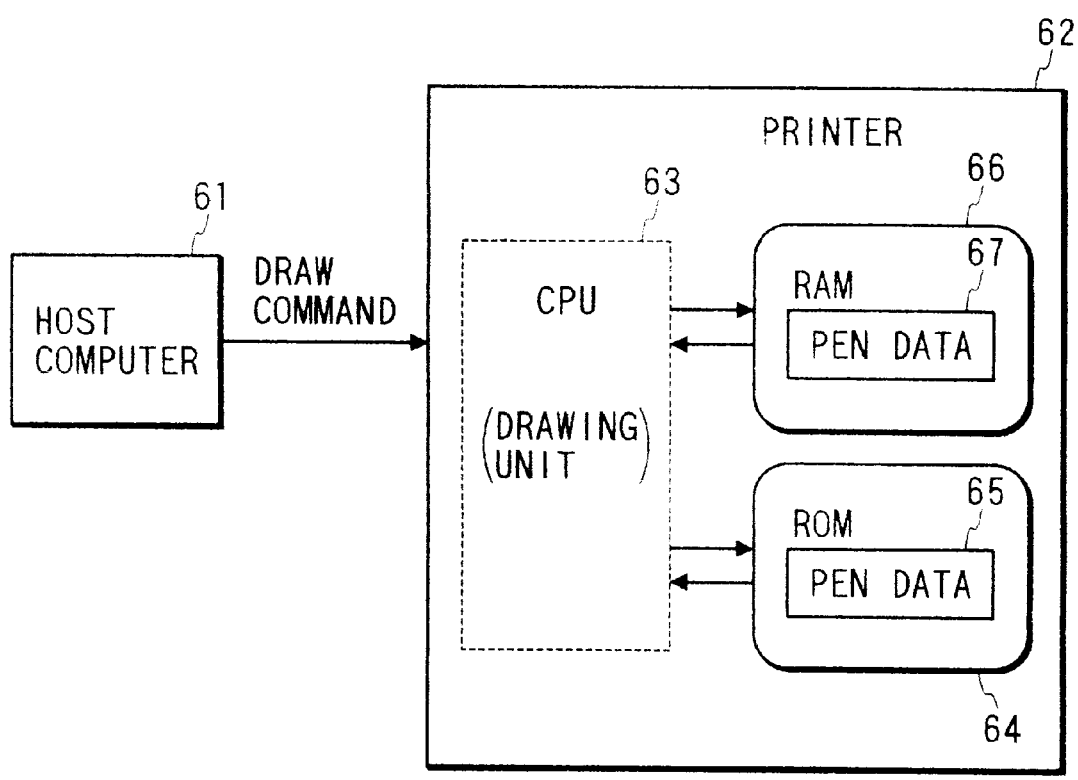
FIG. 6 is a schematic block diagram for explaining a construction of an output apparatus showing an embodiment of the invention.

FIG. 6 is a schematic block diagram for explaining a construction of an output apparatus showing an embodiment of the invention and corresponds to a hardware construction when realizing a pen data forming and managing method for drawing a line.

In the diagram, reference numeral 61 denotes a host computer which transmits the draw command to a printer 62. Reference numeral 63 denotes a CPU for integratedly controlling each unit on the basis of a printer control program stored in an ROM 64 and a control program shown in FIGS. 9 and 10, which will be explained hereinlater. Reference numeral 66 denotes an RAM which is used as a pen cache memory area and a work area of the CPU 63.

Reference numeral 65 denotes pen data in which pen step data of a predetermined width and pen step data obtained by compressing the pen step data have been stored. Reference numeral 67 denotes pen data to store pen step data as a pen cache or a create pen cache.

The invention comprises: memory means (ROM 64) for forming pen data constructed by a set of a slope based on a predetermined number of poly lines which are obtained by line-symmetrically dividing an arc indicating a predetermined line width and having the same radius as the line width, a direction from the center of the arc for a summit, and coordinates of the summit and storing pen step data in which predetermined management information is added to the pen data formed; a pen cache memory for reading out the pen step data of the predetermined line width stored in the memory means and temporarily storing as a cache pen; designating means (by a command designation from the host computer 61) for designating a desired line width; forming means for forming create pen data constructed by a set of a slope based on a predetermined number of poly lines which are obtained by line-symmetrically dividing an arc of the same radius as the line width designated by the designating means, a direction from the center of the arc for the summit, and coordinates of the summit (the CPU 63 forms on the basis of the program stored in the ROM 64); discriminating means (by the CPU 63) for discriminating whether the cache pen of the line width designated by the designating means has been cached in the pen cache memory; and pen cache memory managing means (by the CPU 63) for clearing the pen step data which has already been stored in the pen cache memory and storing the create pen data in the case where it is judged by the discriminating means that the cache pen of the designated line width is not cached in the pen cache memory, wherein when the CPU 63 for discriminating whether the cache pen of the line width designated by the host computer 61 has been cached in the pen cache memory area in the RAM 66 or not judges that the cache pen of the designated line width is not cached in the pen cache memory, the CPU 63 clears the pen step data which has already been stored in the pen cache memory area and stores the create pen data and certainly caches a new create pen into the pen cache memory area, thereby enabling the line of the designated line width to be drawn.

According to the invention, the pen cache memory managing means (by the CPU 63) clears the pen step data which has already been stored in the pen cache memory and stores the create pen data while updating the predetermined management information which has already been stored. Therefore, even if the contents in the pen cache memory are rewritten, the pen step data of the line width designated can be read out from the pen cache memory.

According to the invention, the new create pen is certainly cached into the pen cache memory area and the line of the designated line width is drawn, thereby enabling the display means (LCD display, FLCD display, CRT, plasma display, etc. which are not shown) to execute the line drawing display by using the create pen which was drawn.

According to the invention, the new create pen is certainly cached into the pen cache memory area and the line of the designated line width is drawn, thereby enabling the printing means (printer 62) to execute the line drawing printing by using the create pen which was drawn.

In the embodiment, the case of forming and managing the pen data in the drawing of a line of a maximum line width of 1000 will now be described.

The compressed data of the pen data of the line widths "0" to "50" is held in the ROM 64 as a pen data memory medium.

As mentioned above, hitherto, in an approaching process to the pen step data, since the pen step data from the minimum line width to the maximum cache line width has been continuously stored in the pen step table C, the value of the designated line width directly becomes the entry to the vertical pen step index table B of the horizontal pen step indices A and B.

Figure 7:
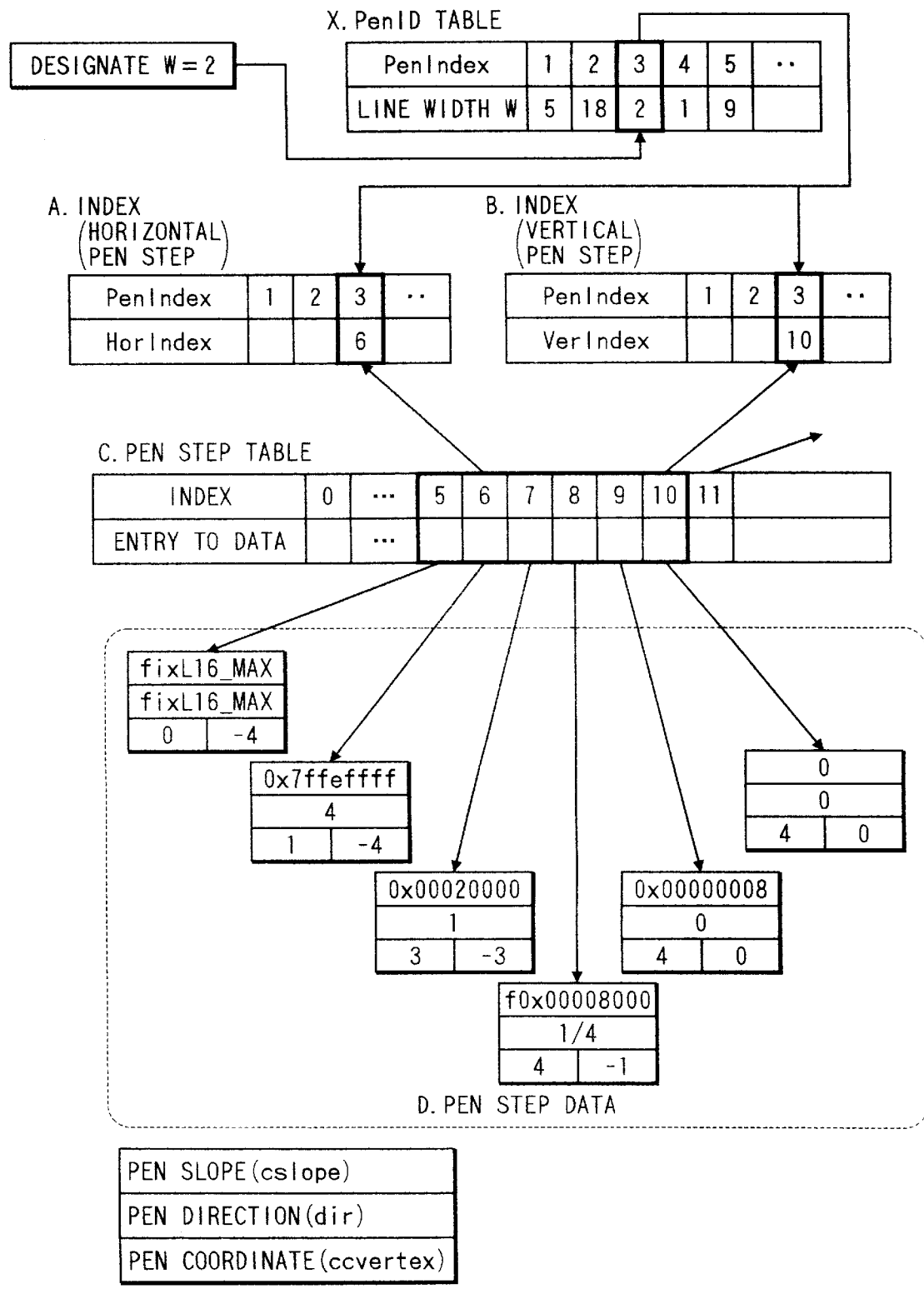
FIG. 7 is a diagram for explaining a data structure of a pen step of a poly pen in the output apparatus according to the invention.

In the embodiment, since the pen step data is sequentially stored into the pen step table C in accordance with the forming order, a pen ID table X is provided as shown in FIG. 7 and the line widths are sequentially registered in accordance with the forming order.

FIG. 7 is a diagram for explaining a data structure of a pen step of a poly pen in the output apparatus according to the invention and corresponds to a construction such that the pen step of the poly pen, for example, is stored into the RAM 66 shown in FIG. 6.

In FIG. 7, the pen of the line width 2 is registered by a pen ID of "3" by regarding that it was cached at the third time. When a line width designation command comes, the relevant pen step data is searched from the index tables A and B by the pen ID.

A pen caching method in the case where pen forming commands are sequentially generated in accordance with the order of different line widths such as line width 10 → line width 100 → line width 1000 will now be described hereinbelow with reference to FIGS. 8, 9, and 10.

Figure 8:
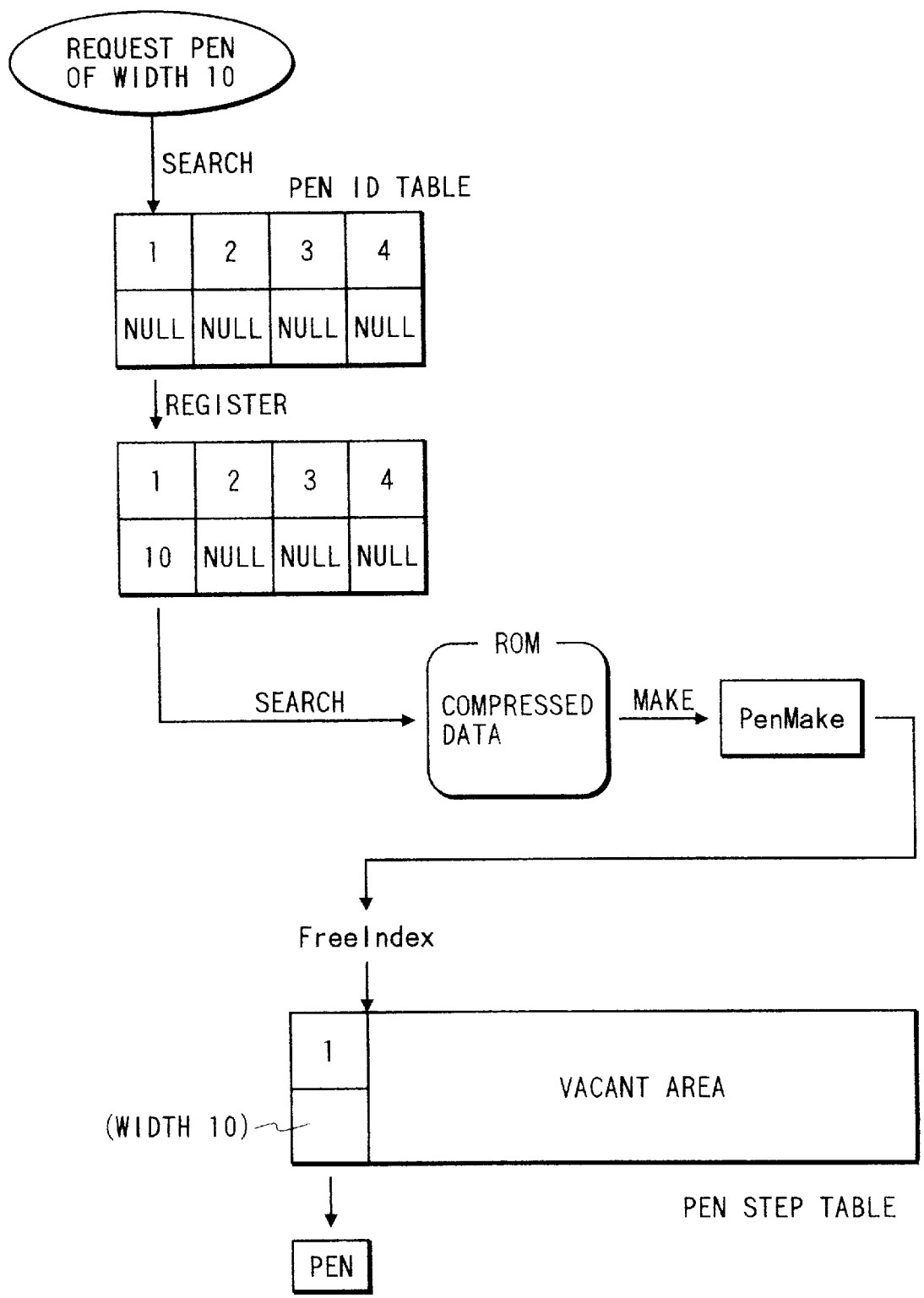
FIG. 8 is a conceptual diagram for explaining a processing transition of the pen step data of the output apparatus according to the invention.

FIG. 8 is a conceptual diagram for explaining a processing transition of the pen step data of the output apparatus according to the invention.

Figure 9:
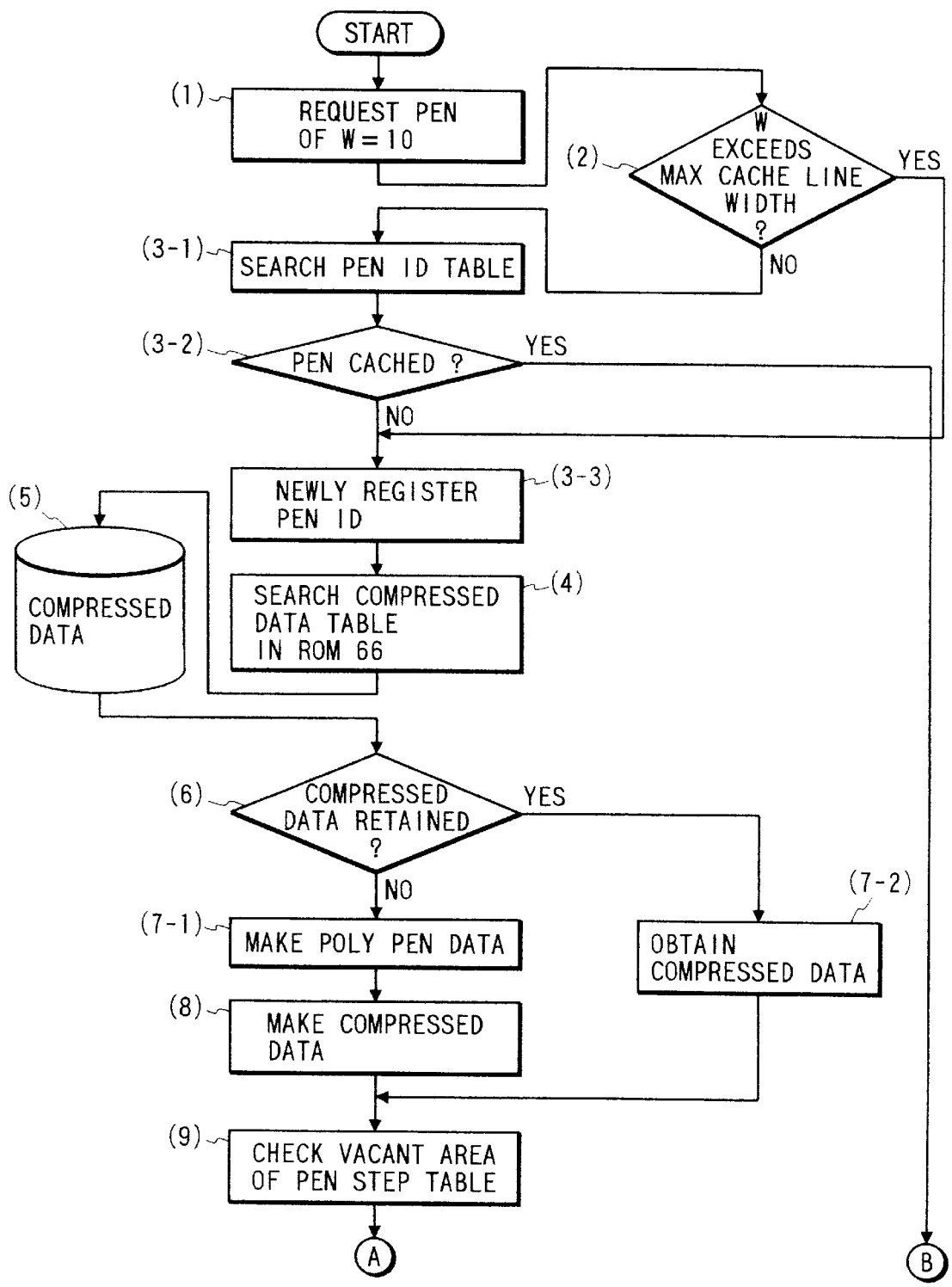
FIG. 9 is a flowchart showing an embodiment of a pen step data processing method of the output apparatus according to the invention.
Figure 10:
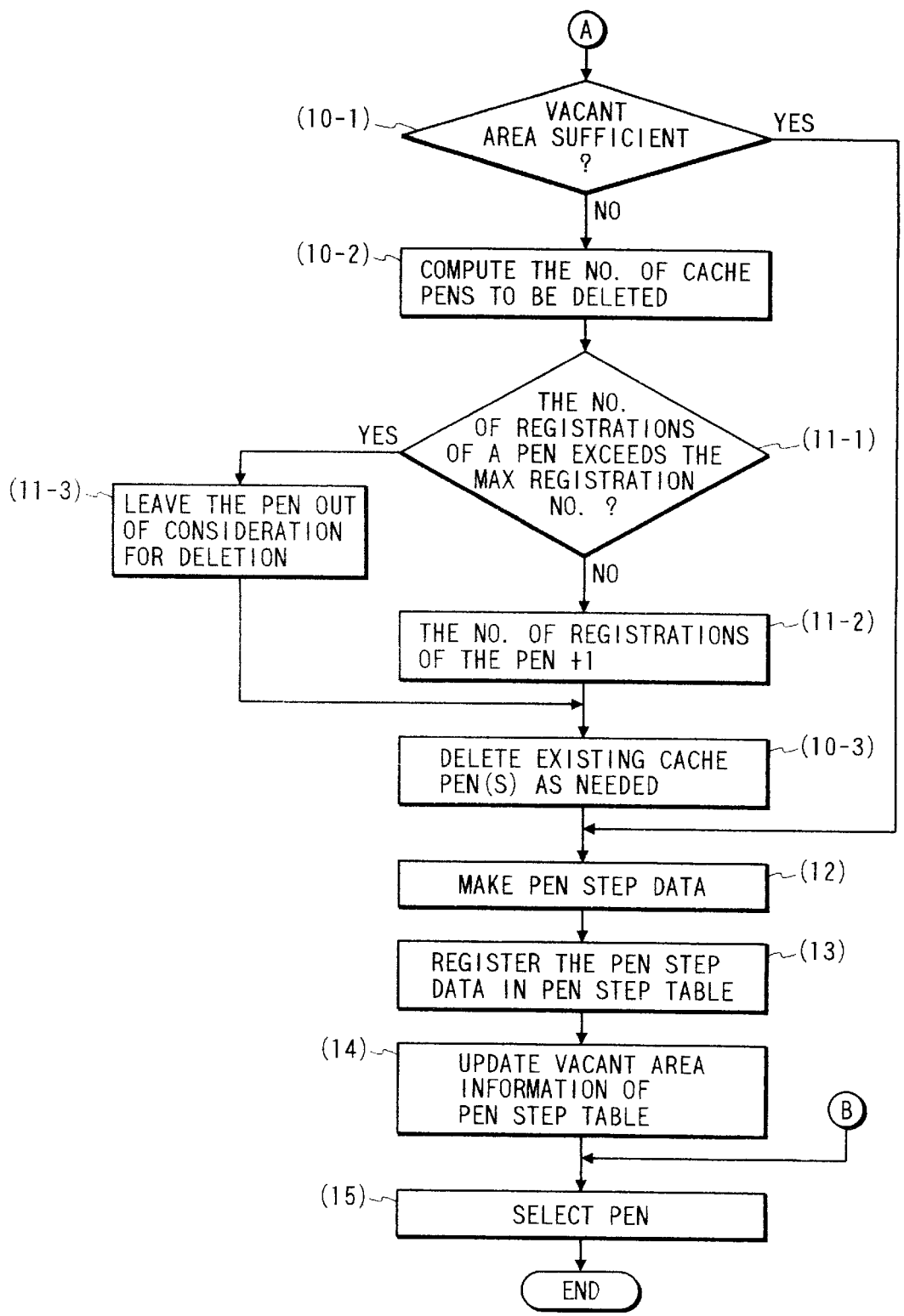
FIG. 10 is a flowchart showing an embodiment of a pen step data processing method of the output apparatus according to the invention.

FIGS. 9 and 10 are flowcharts showing an embodiment of a pen step data processing method of the output apparatus according to the invention. Reference numerals (1) to (15), (3-1) to (3-3), (10-1) to (10-3), and (11-1) to (11-3) denote processing steps, respectively.

[Processing stage at which the pen of the line width 10 is selected upon initialization of the program]

In FIG. 3, when the pen of the line width W=10 is requested (1), a check is made to see if the line width W exceeds the maximum cache line width (2). If YES, the processing routine advances to step (3-3). If NO, the pen ID table is searched (3-1). A check is made to see if the pen has been cached (3-2). If YES, step (15) follows.

In the example of FIG. 8, since PENID[1]=NULL and nothing is registered, the pen of the line width 10 is newly registered as PENID[1]=10 in step (3-3).

A check is made to see if the data of the line width 10 has been held in the compressed data table in the ROM 66 (4) to (6). In the embodiment, since 10<50 (maximum width of the compressed data held in advance), this data is extracted (7-2).

If NO in step (6), the poly pen data is formed (7-1) and the compressed data is formed (8).

Subsequently, with reference to a FreeIndex of the pen step data, a check is made to see if there is a vacant area enough to store the pen step data of the width 10 (9) and a check is made to see if the vacant area in the pen step table is sufficient (10-1). If YES, step (12) follows and the pen step data is formed.

If NO in step (10-1), the number of existing cache pens to be deleted is calculated (10-2). A check is made to see if the number of registration of the pens as targets to be deleted exceeds the maximum registration number (11-1). If YES, the corresponding pens are left out of consideration for deletion (11-3). The processing routine is returned to step (10-3).

If NO in step (11-1), the number of registration of the pens to be deleted is increased by "1" (11-2). Step (10-3) follows.

In step (10-3), the existing cache pens as many as the number enough to store the pen step data are deleted from the cache pens in which the number of registration is smaller.

When it is judged in step (10-1) that the vacant area is sufficient, the pen step data is formed from the extracted compressed data (12) and is registered into the pen step table (13).

Finally, the FreeIndex in the pen step table is progressed by an amount of the registered data and the position of the vacant area to register the next pen is updated (14). The pen is selected (15). The processing routine is finished.

[Process to form the pen of line width 100 during the execution of program]

The processes for forming the pen of the line width 100 during the execution of the program will now be described hereinbelow with reference to FIGS. 11, 9, and 10.

Figure 11:
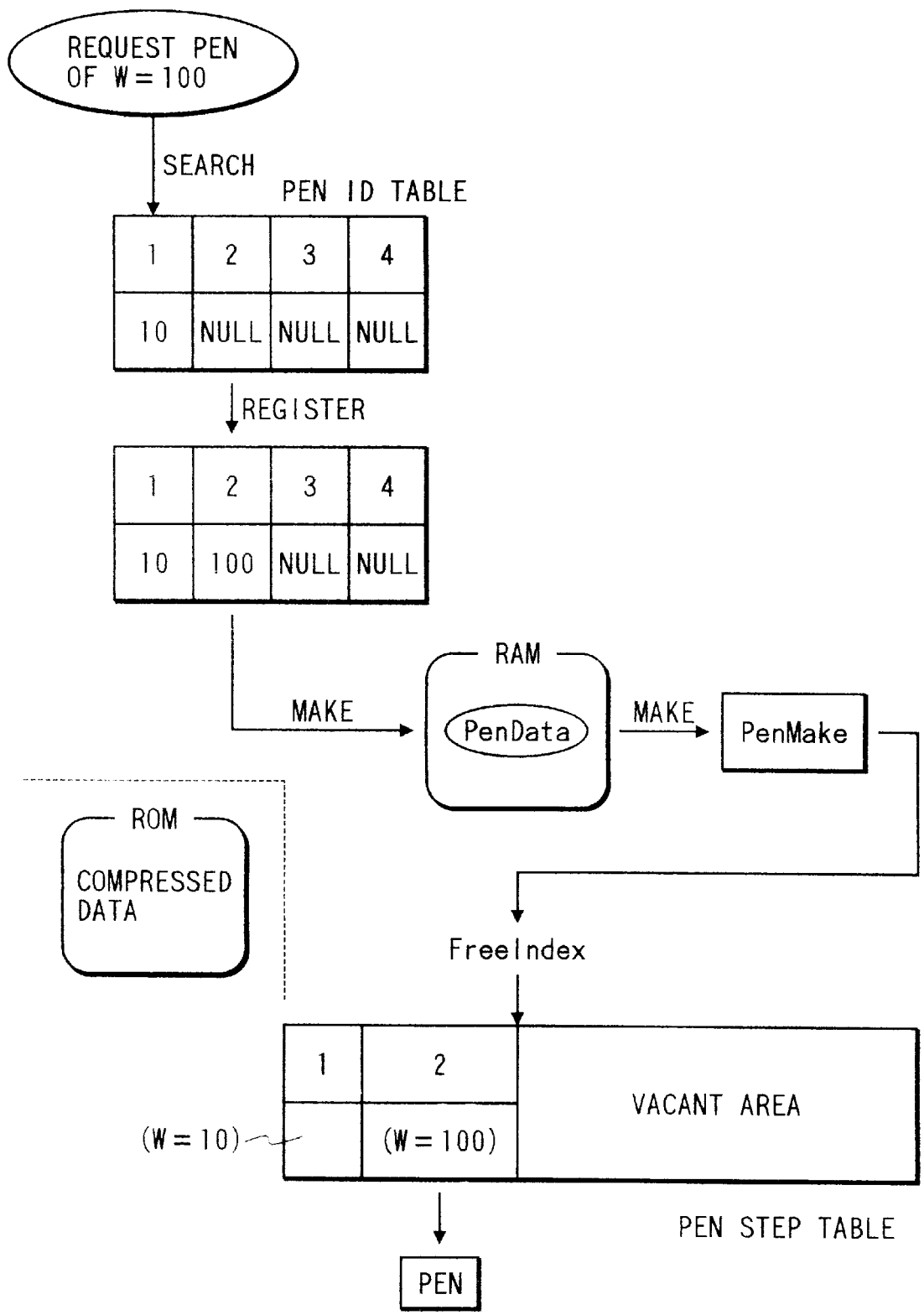
FIG. 11 is a conceptual diagram for explaining a processing transition of the pen step data of the output apparatus according to the invention.

FIG. 11 is a conceptual diagram for explaining a processing transition of the pen step data of the output apparatus according to the invention.

In FIG. 11, when the pen of the line width 100 is requested, the pen ID table is searched (3-1). In the embodiment, since PENID[1]=10 and PENID[2]=NULL and the pen of the width 100 is not cached (3-2), the pen of the width 100 is registered as PENID[2]=100 (3-3).

A check is subsequently made to see if the data of this width has been held in the compressed data table in the ROM 64 (6). In the embodiment, as shown in FIG. 11, since the compressed data corresponding to the width 100 is not held (100>50), new poly pen data and compressed data are sequentially formed in accordance with this order (7-1) and (8).

Subsequently, with reference to the FreeIndex in the pen step table, a check is made to see if there is a vacant area enough to store the pen step data of the width 100 (9). When it is judged that the vacant area still remains (10-2), the pen step data is formed from the compressed data formed (12) and is registered into the pen step data (13).

Finally, the FreeIndex in the pen step table is progressed by an amount of the registered data and the position of the vacant area to register the next pen is updated (14). The pen is selected (15). The processing routine is finished.

[Process to form the pen of the line width 1000 during the execution of program]

The processes for forming the pen of the line width 1000 during the execution of the program will now be described hereinbelow with reference to FIGS. 12, 9, and 10.

Figure 12:
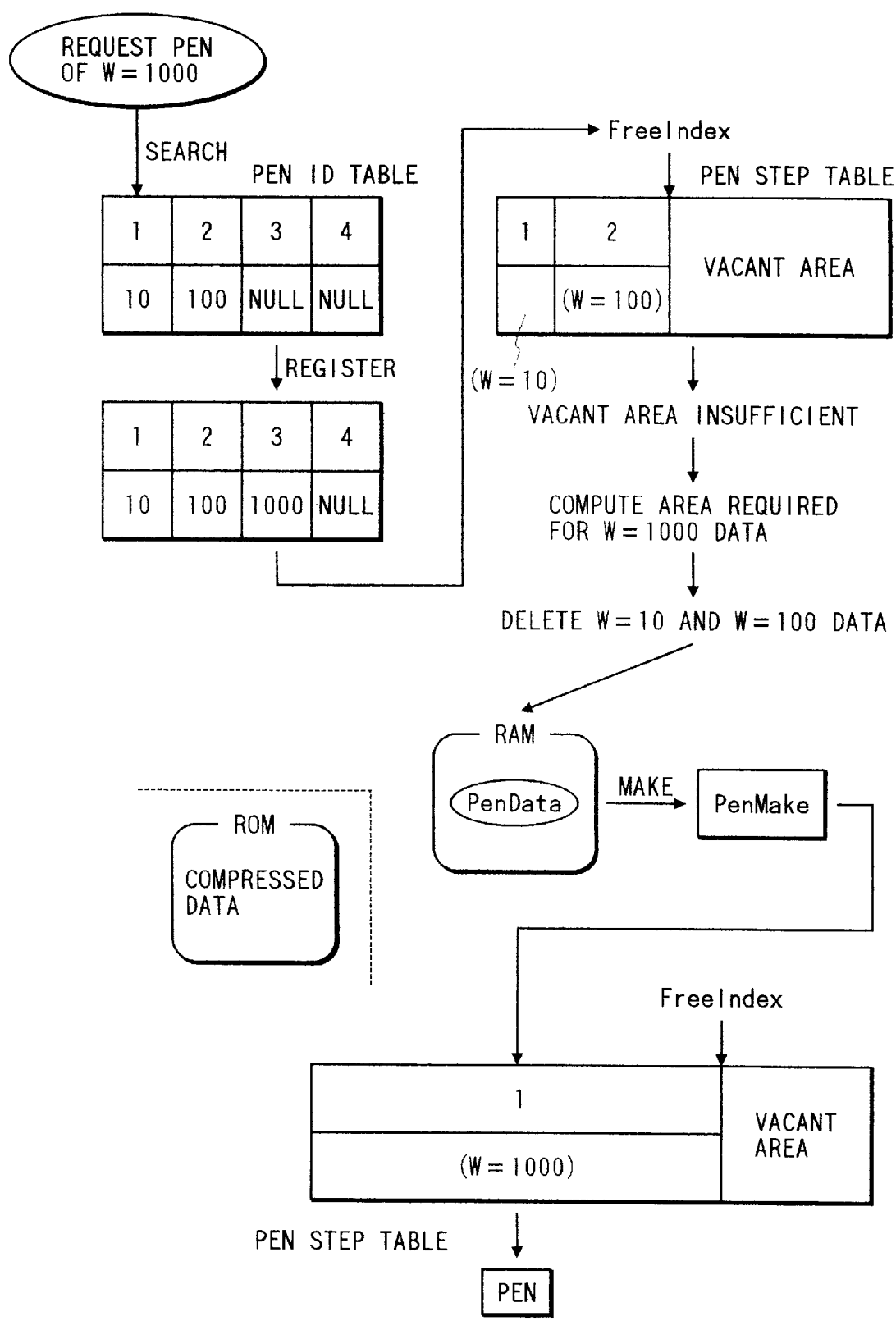
FIG. 12 is a conceptual diagram for explaining a processing transition of the pen step data of the output apparatus according to the invention.
Figure 13:
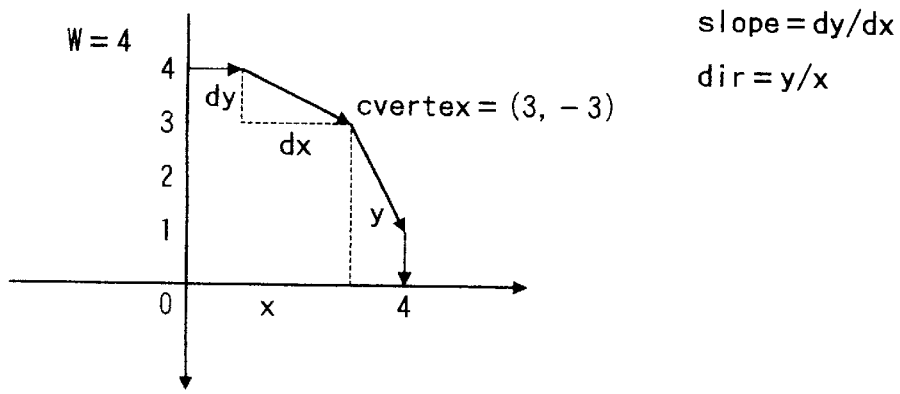
FIG. 13 is a diagram for explaining a pen step of a poly pen in such a kind of output apparatus.
Figure 14:
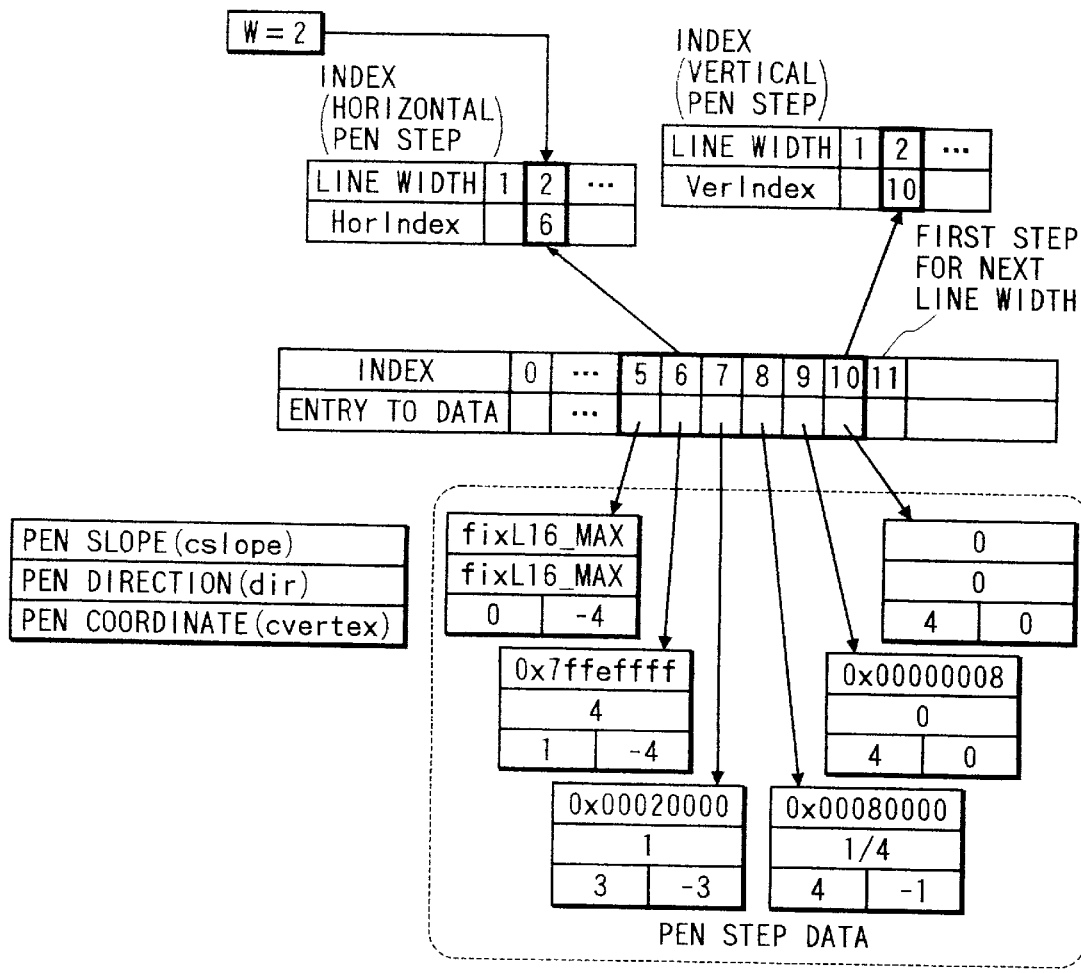
FIG. 14 is a diagram for explaining a data structure of the pen step of the poly pen in such a kind of output apparatus.
Figure 15:
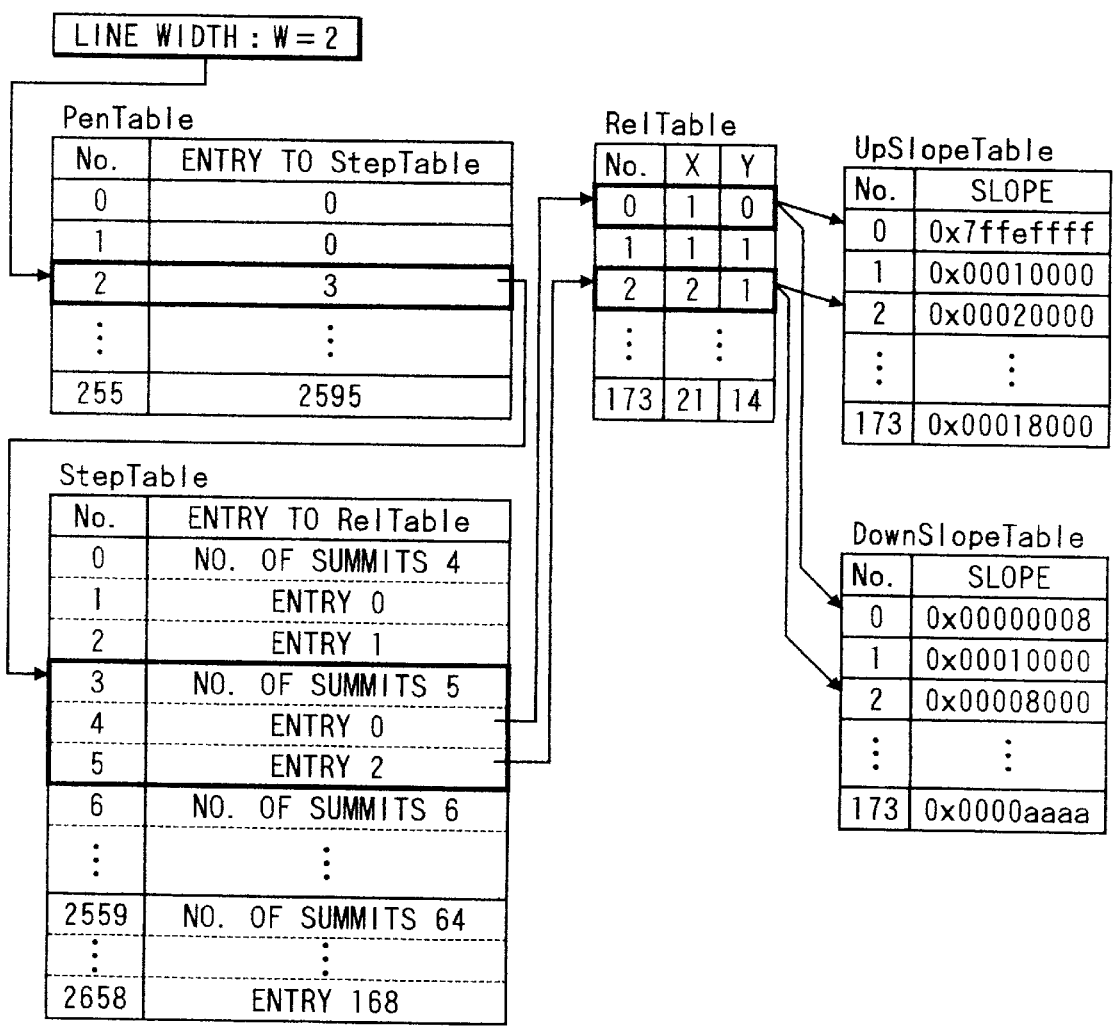
FIG. 15 is a diagram for explaining a data structure of the pen step of the poly pen in such a kind of output apparatus.
Figure 16:
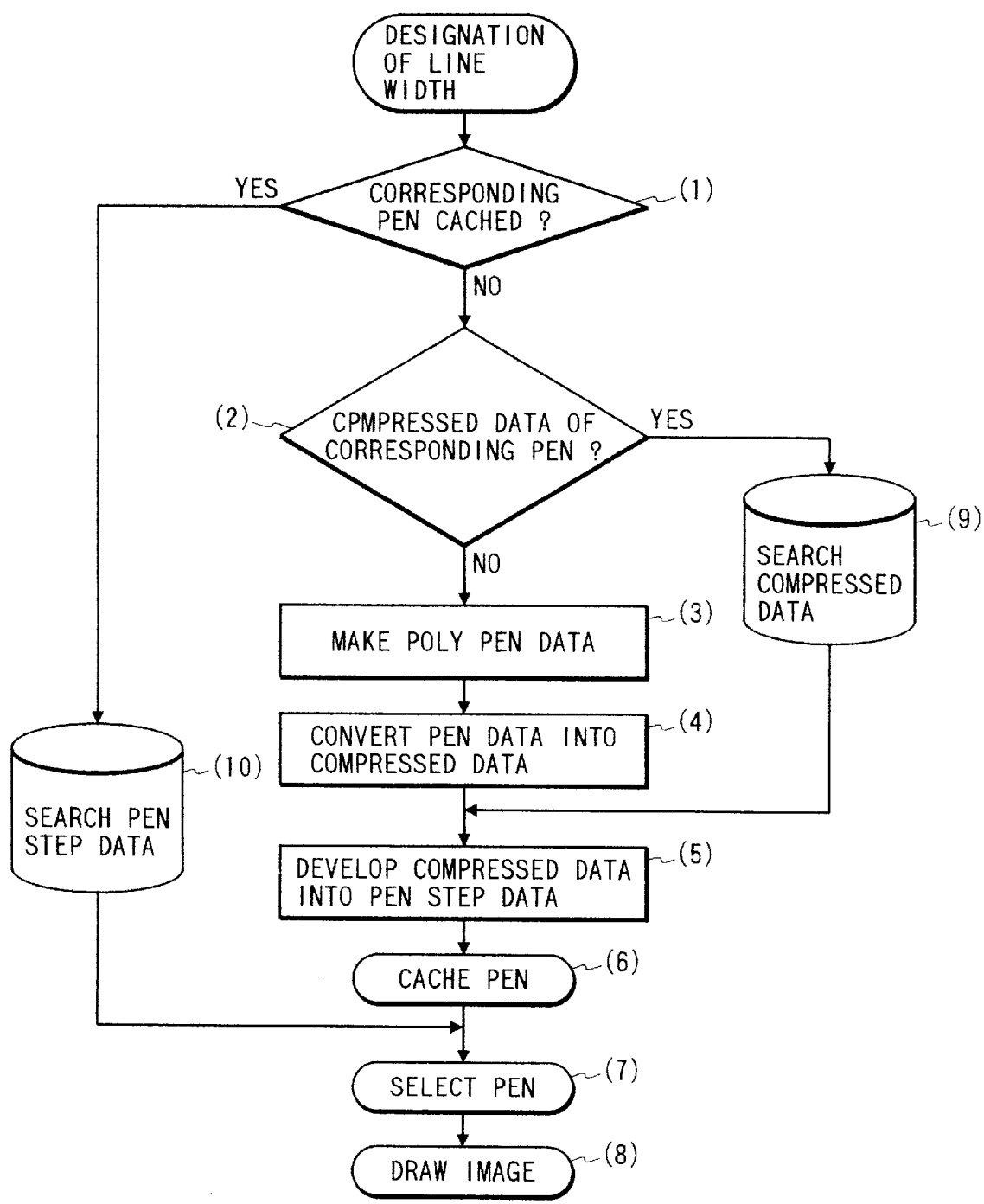
FIG. 16 is a flowchart showing an example of a pen drawing processing procedure in such a kind of output apparatus.
Figure 17:
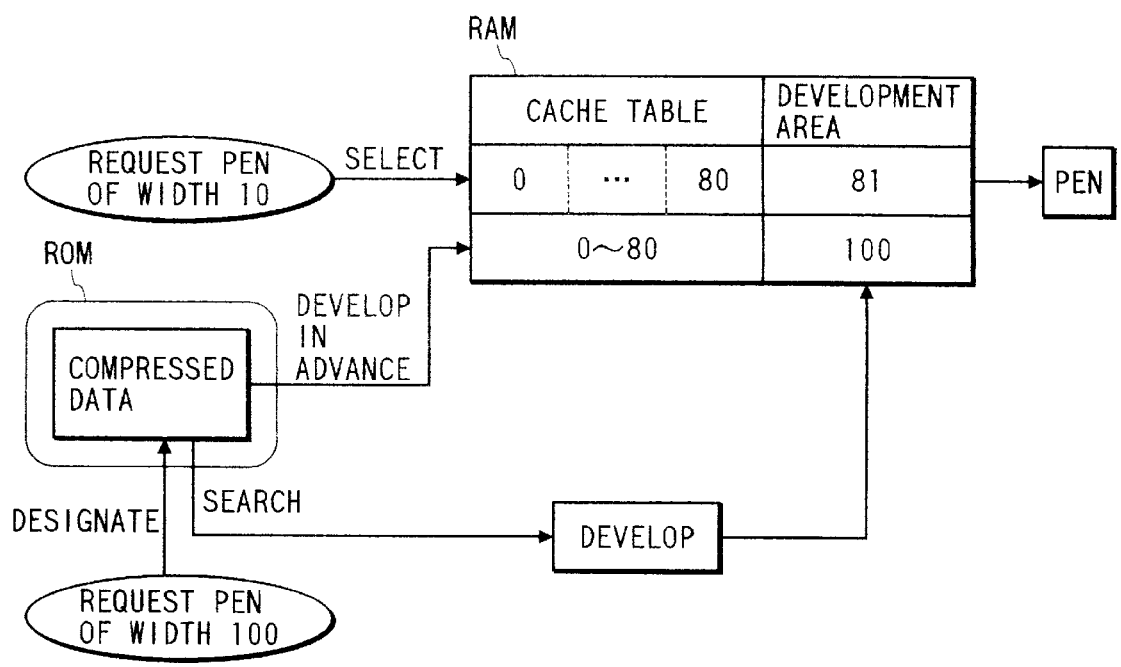
FIG. 17 is a diagram for explaining a drawing processing state in such a kind of output apparatus.

FIG. 12 is a conceptual diagram for explaining a processing transition of the pen step data of the output apparatus according to the invention.

In FIG. 12, when the pen of the width 1000 is requested, the pen ID table is searched (3-1). In the embodiment, PENID[1]=10, PENID[2]=100, PENID[3]=NULL, and the pen of the width 1000 is not yet registered (3-2). Therefore, in the embodiment, the pen of the width 1000 is newly registered as PENID[3]=1000 (3-3).

Subsequently, a check is made to see if the data of this width has been held in the compressed data table in the ROM 64 (6). In the embodiment, since the compressed data corresponding to the width 1000 is not held (1000>50), a poly pen, data, and compressed data are newly formed in accordance with this order (7-1) and (8).

With reference to the FreeIndex in the pen step table, a check is made to see if there is a vacant area enough to store the pen step data of the width 1000 (10-1). Since it is now judged that the vacant area is insufficient, in order to register the pen step data of the width 1000, an amount of existing data to be deleted is calculated (10-2). The existing cache pens as many as the necessary number are sequentially deleted in accordance with the order of the older registration, namely, from the smaller pen ID (10-3).

The pen step data is subsequently formed from the compressed data formed (12) and is registered into the pen step table (13).

Finally, the pen IDs of the deleted pens are erased and the FreeIndex in the pen step table is updated (14). The pen is selected (15). The processing routine is finished.

According to the invention, there is provided the diagram drawing processing method of the output apparatus having the memory means (ROM 64) for forming pen data constructed by a set of a slope based on a predetermined number of poly lines which are obtained by line-symmetrically dividing an arc indicating a predetermined line width and having the same radius as the line width, a direction from the center of the arc for a summit, and coordinates of the summit and storing pen step data in which predetermined management information is added to the pen data formed, the pen cache memory (RAM 66) for reading out the pen step data of the predetermined line width stored in the memory means and temporarily storing as a cache pen, and the designating means (by a command designation from the host computer 61) for designating a desired line width, wherein there are executed: the forming step [preprocess in step (1) in FIG. 9] of forming the create pen data constructed by a set of a slope based on a predetermined number of poly lines which are obtained by line-symmetrically dividing an arc of the same radius as the line width designated by the designating means, a direction from the center of the arc for a summit, and coordinates of the summit; the discriminating step [step (3-1) in FIG. 9] of discriminating whether the cache pen of the line width designated by the designating means has been cached in the pen cache memory; the clearing step [step (10-3) in FIG. 10] of clearing the pen step data which has already been stored in the pen cache memory and keeping the area to register the create pen data; the registering step [step (13) in FIG. 10] of registering the create pen data into the pen cache memory; and the updating step [step (14) in FIG. 10] of updating the predetermined management information in the pen cache memory, and wherein the new create pen is certainly cached into the pen cache memory area, thereby enabling the line drawing process of the designated line width to be programmably executed.

According to the invention, the new create pen is certainly cached into the pen cache memory area and the line of the designated line width is drawn, thereby making it possible to automatize the process for allowing the display means [LCD display, FLC display, CRT, plasma display, etc. (not shown)] to perform the line drawing display by using the create pen which was drawn.

According to the invention, the new create pen is certainly cached into the pen cache memory area and the line of the designated line width is drawn, thereby making it possible to automatize the process for allowing the printing means (printer 2) to execute the line drawing printing by using the create pen which was drawn.

In the processes of FIG. 9 mentioned above, the case of advancing from step (1) to step (3-1) has been described. However, by adding maximum cache line width information, namely, the maximum line width of the registered cache pen is possessed as information in step (1) and by adding step (2) of judging whether the line width of the pen requested doesn't exceed the maximum cache line width or not before entering step (3), the processing routine is unconditionally shifted to the making of the compressed data in the case where the requested pen is larger than the maximum cache line width.

In step (10-3), in case of deleting the existing cache pens by the new pen forming request by adding the process (11) for holding the number of registration and deletion every line width, namely, adding registration number information and for excluding the pens which were registered a predetermined number of times or more, it is also possible to control in a manner such that the cache pens in which a possibility such that they will be again registered in the future is high are preserved.

Although the above embodiment has been described with respect to the example of the printer as an output apparatus, the invention can be also applied to a display for developing the data to be outputted into the VRAM and for displaying and outputting.

According to the embodiment as described above, in the case where the discriminating means for discriminating whether the cache pen of the line width designated by the designating means has been cached into the pen cache memory or not judges that the cache pen of the designated line width is not cached in the pen cache memory, the pen cache memory managing means clears the pen step data which has already been stored in the pen cache memory and stores the create pen data, so that the create pen of the new line width is certainly cached into the pen cache memory area, thereby enabling the line drawing process of the designated line width to be efficiently executed.

According to the embodiment, the pen cache memory managing means clears the pen step data which has already been stored in the pen cache memory and stores the create pen data while updating the predetermined management information which has already been stored, so that even if the contents in the pen cache memory are rewritten, the pen step data of the designated line width can be read out from the pen cache memory.

According to the embodiment, a check is made to see if the cache pen of the line width designated by the designating means has been cached in the pen cache memory, the pen step data which has already been stored in the pen cache memory is cleared, the area to register the create pen data is assured, the create pen data is registered into the pen cache memory, and the predetermined management information in the pen cache memory is updated, so that the new create pen is certainly cached into the pen cache memory area, thereby enabling the line drawing process of the designated line width to be programmably executed.

According to the embodiment, the new create pen is certainly cached into the pen cache memory area and the line drawing process of the designated line width is executed, thereby enabling the display means to execute the line drawing display by using the create pen which was drawn.

According to the embodiment, the new create pen is certainly cached into the pen cache memory area and the line drawing process of the designated line width is executed, thereby enabling the printing means to execute the line drawing printing by using the create pen which was drawn.

According to the embodiment, the new create pen is certainly cached into the pen cache memory and the line drawing process of the designated line width is executed, thereby making it possible to automatize the process for allowing the display means to execute the line drawing display by using the create pen which was drawn.

According to the embodiment, the new create pen is certainly cached into the pen cache memory area and the line drawing process of the designated line width is executed, thereby making it possible to automatize the process for allowing the printing means to execute the line drawing printing by using the create pen which was drawn.

Therefore, there are effects such that the range where the cache pen is held in advance and the range where the create pen which is dynamically formed in accordance with the designated line width is cached are freely changed and the line of the designated line width can be efficiently drawn and the like.

[Embodiment 3]

Figure 18:
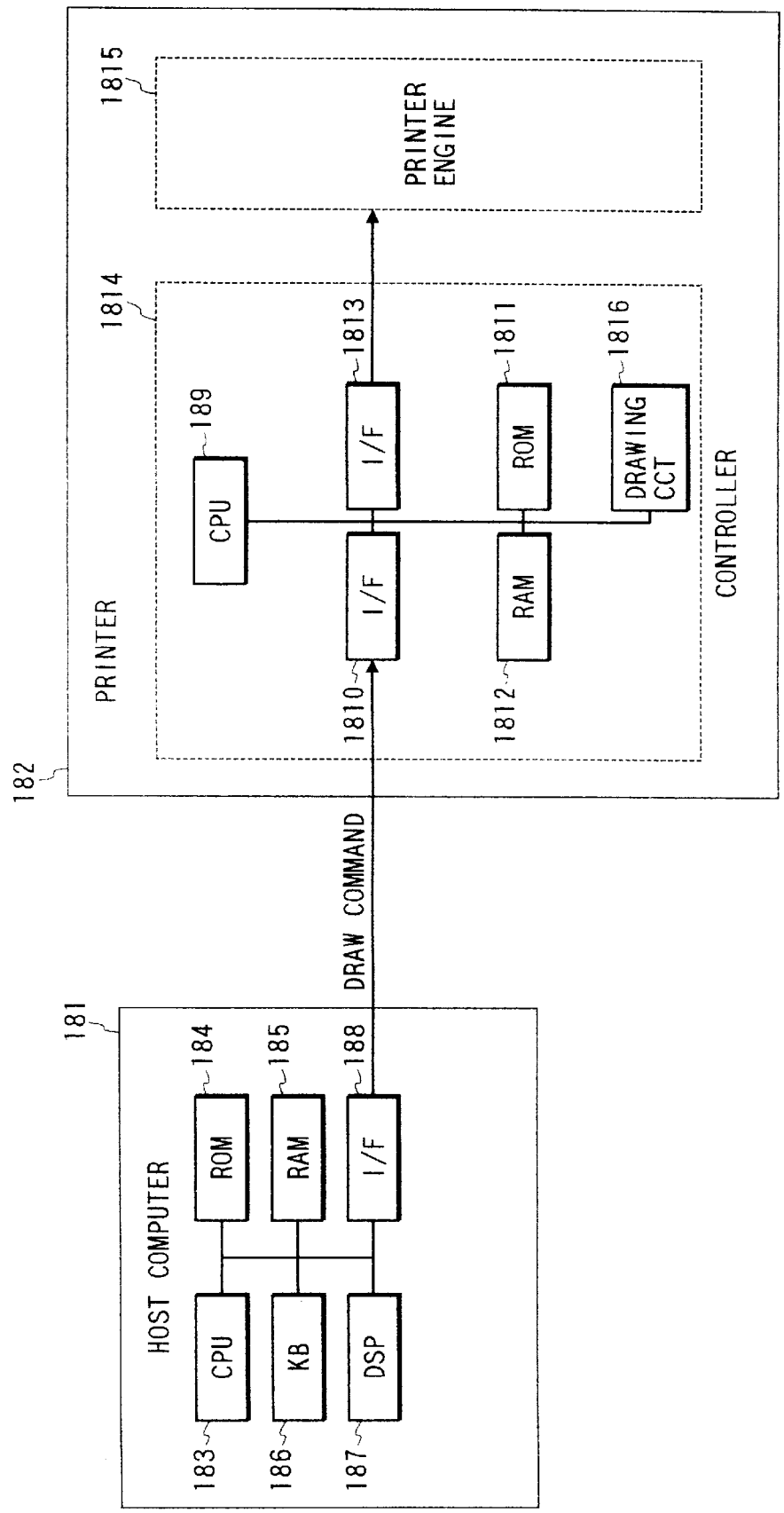
FIG. 18 is a diagram showing a hardware construction to realize the invention.

FIG. 18 is a hardware construction to realize the invention.

Reference numeral 181 denotes a host computer constructed by: a CPU 183 to control the entire host computer; an ROM 184 to store various control programs, font data, and the like; an RAM 185 which is used as a work area; a keyboard (KB) 186 for inputting character data, command, or the like; a display (DSP) 187 for displaying characters, figure, or image; and an interface (I/F) 188 for transmitting data or commands to the printer.

Figure 20:
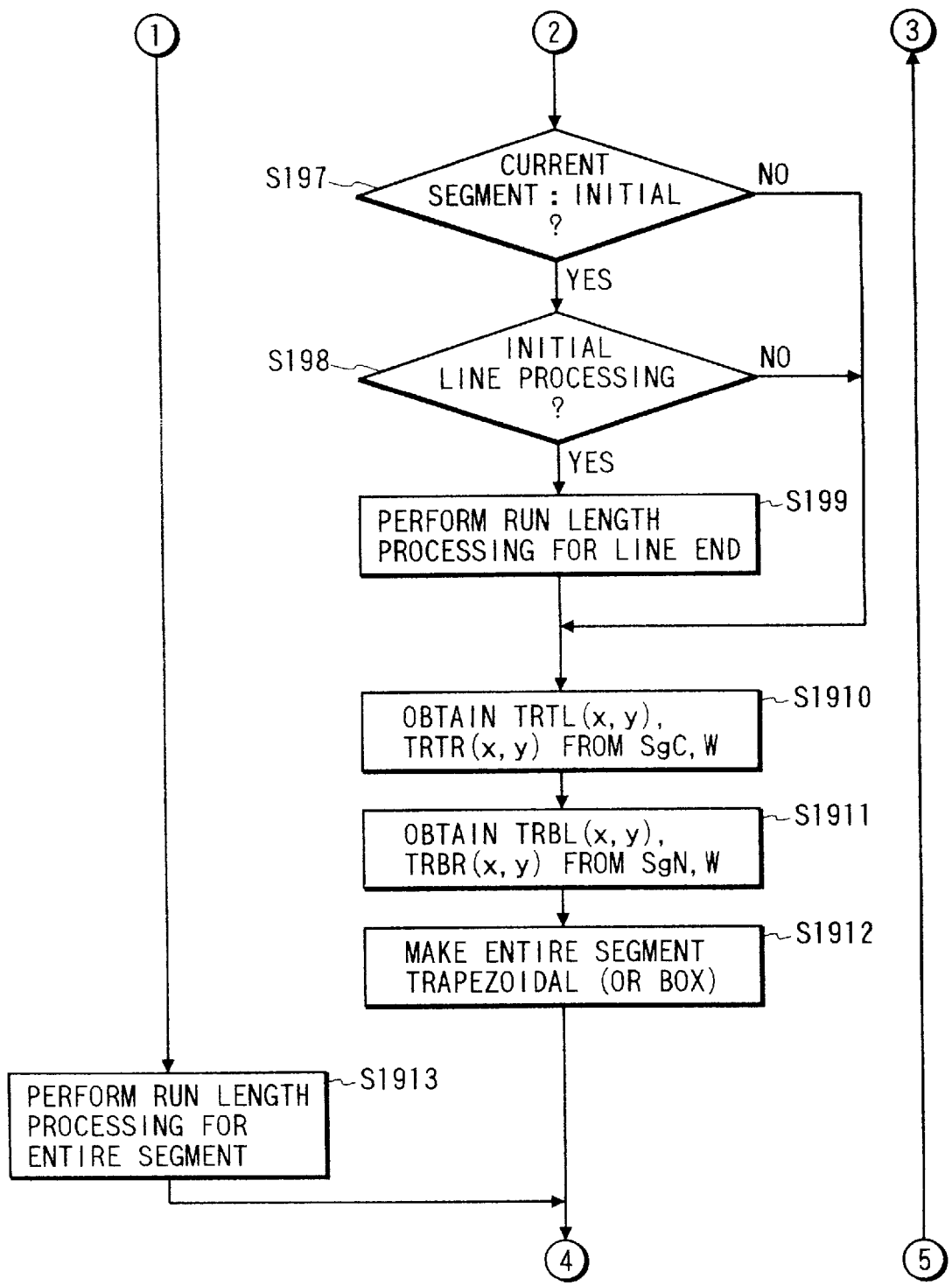
FIG. 20 is a diagram showing an algorithm when drawing a line according to the invention.
Figure 21:
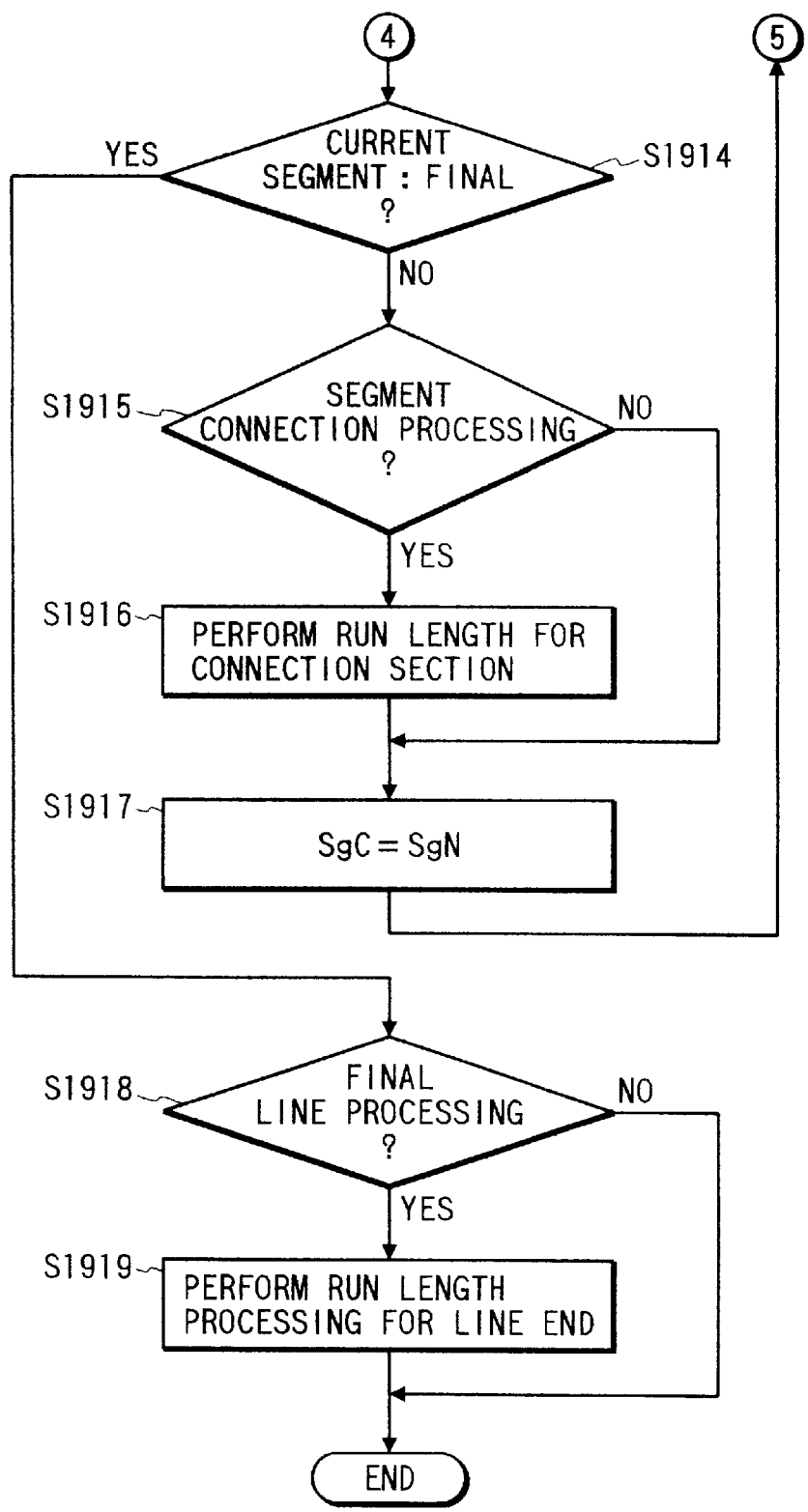
FIG. 21 is a diagram showing an algorithm when drawing a line according to the invention.

Reference numeral 182 denotes a printer constructed by a controller 1814 and a printer engine 1815 of the electrophotographic system. The controller 1814 is constructed by: a CPU 189 to control the entire printer; an ROM 1811 to store various control programs (also including programs shown in flowcharts of FIGS. 19 to 21, which will be explained hereinlater), font data, etc.; an RAM 1812 which is used as a reception buffer for storing commands and data from the host computer, an object memory for storing an object (intermediate language) formed on the basis of the received commands and data, a page memory for storing a bit map which is drawn on the basis of the object, or a work area; an interface 1810 to receive the data from the host; an interface 1813 to transmit an image signal based on the bit map data to the printer engine 1815; and a drawing circuit 1816 to receive the data of the object form and draw the bit map data into the page memory.

Figure 19:
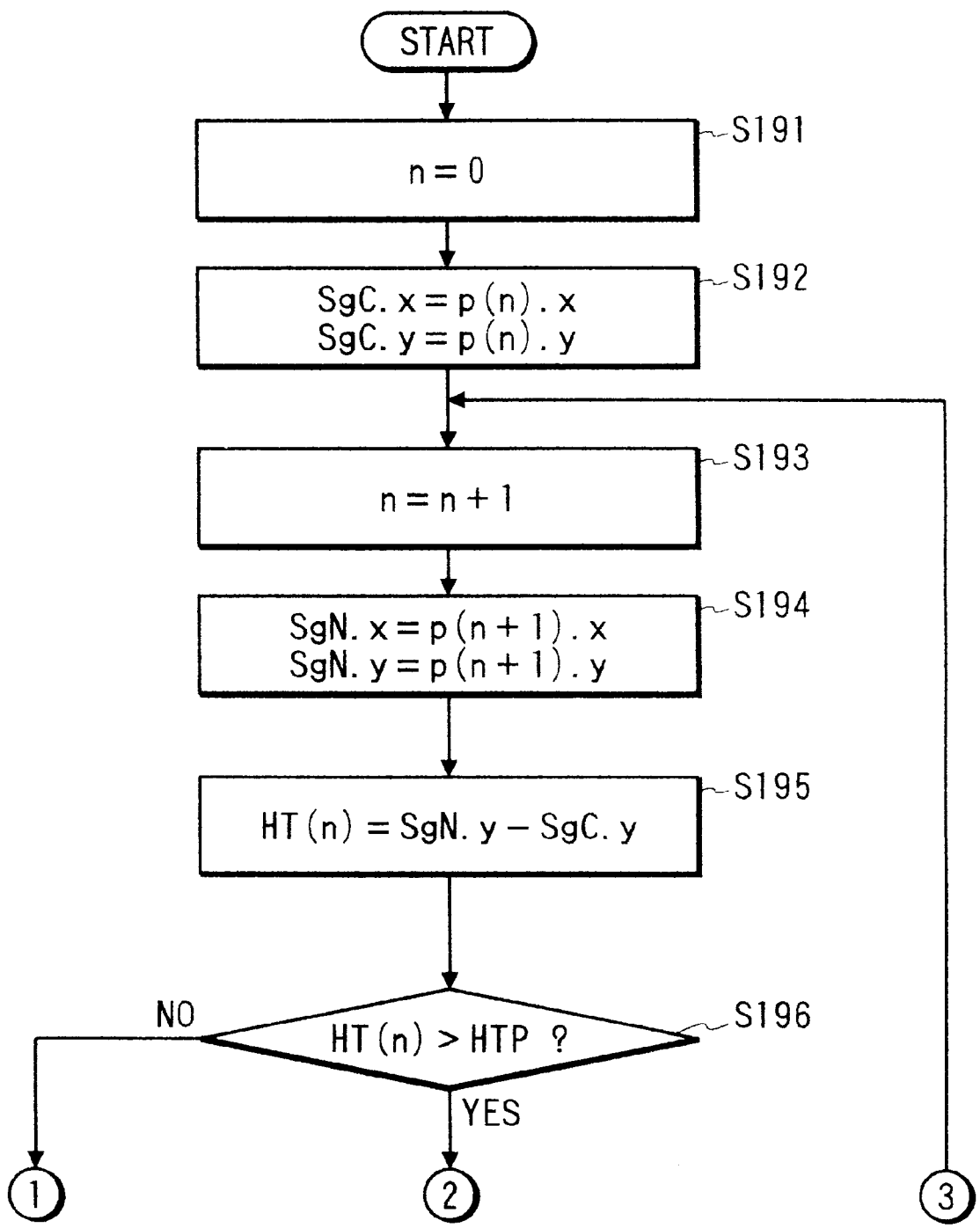
FIG. 19 is a diagram showing an algorithm when drawing a line according to the invention.
Figure 22:
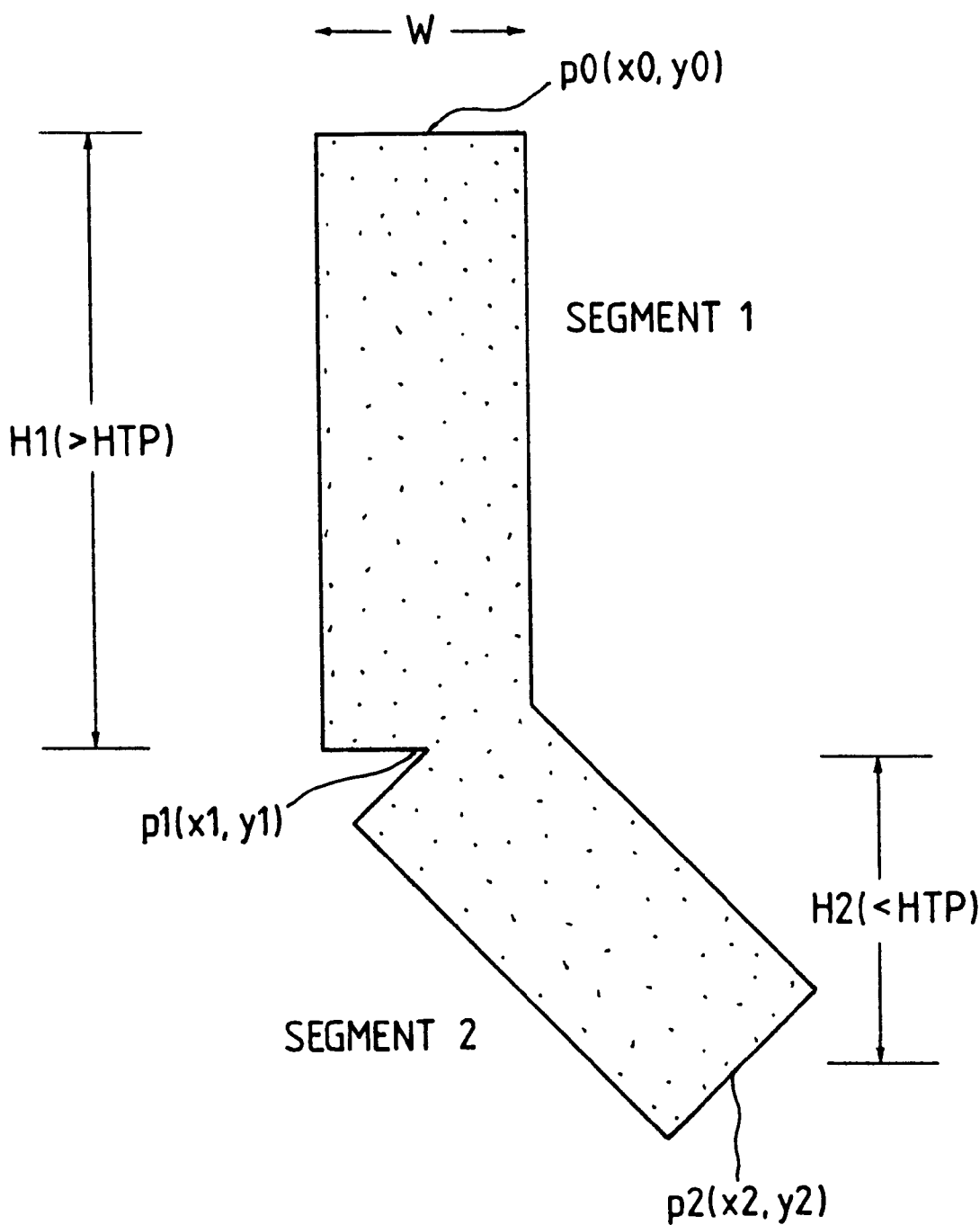
FIG. 22 is a diagram showing diagram data which is handled in the embodiment.

An algorithm to draw a line consisting of two segments is shown as an embodiment. In FIG. 22, a start position of the line to be drawn is set to p0, a start position of the second segment is set to p1, and an end position of the line is set to p2. A line has dimensions such that line width is set to W, a height and a slope of the first segment are respectively set to H1 and S1 (=0°) (vertical), and a height and a slope of the second segment are respectively set to H2 and S2 (=45°). There is no processing in the connecting portions of the initial and final line ends and the segments. It is now assumed that the effective reference height of the trapezoid processing calculated by a drawing processing function or the like is set to HTP. In the algorithm shown in FIG. 19, it is assumed that a dot train p (0–1) of the line and the number of segments (=2) have previously been given. The program according to the flowchart of FIG. 19 is stored into the ROM 1811 and processed by the CPU 189.

After the start of the drawing, the number n of the current segment which is at present being processed is initialized in step S191. The start position of the line is set to a position (SgC) of the current segment in S192. The segment number is increased by "1" and is set to n=1 in S193. A position (SgN) of the next segment which is processed next is set in S194. A height HT(1) of the current (initial) segment is obtained from the y coordinates of the set positions SgC and SgN.

In S196, HT(1) and the trapezoid processing effective reference height HTP are compared. Since HT1 is larger than HTP, it is judged that the trapezoid processing is effective, so that the processing routine advances to S197. Since the segment number is set to "1", the current segment is the initial segment and the processing routine is shifted to S198. However, since the initial line processing is not executed, the processing routine advances to S1910. Thus, the entire segment becomes a trapezoid.

In S1910 and S1911, four coordinate values of the top, bottom, right, and left edges which are necessary for the trapezoid processing are obtained. The entire segment is trapezoid processed (S1912) on the basis of those coordinate values and the slope S1 of the segment.

After that, since n≠2 (the number of segments) in S1914, the processing routine advances to step S1915 of the connecting portion. Since there is no connection processing in this step as well, S1917 follows and the next segment is replaced to the current segment. The processing routine is returned to S193.

After the processes were subsequently similarly executed by setting n=2 in S193, since HT2<HTP in S196, it is judged that the trapezoid processing is ineffective. The entire segment is run length processed on the basis of SgC, SgN, and line width W in S1913.

Subsequently, in S1914, since the segment number 2 coincides with the number of segments, it is judged that the current segment is the final segment, the processing routine advances to S1918. Since there is no final line end, the processing routine is finished.

Figure 23:
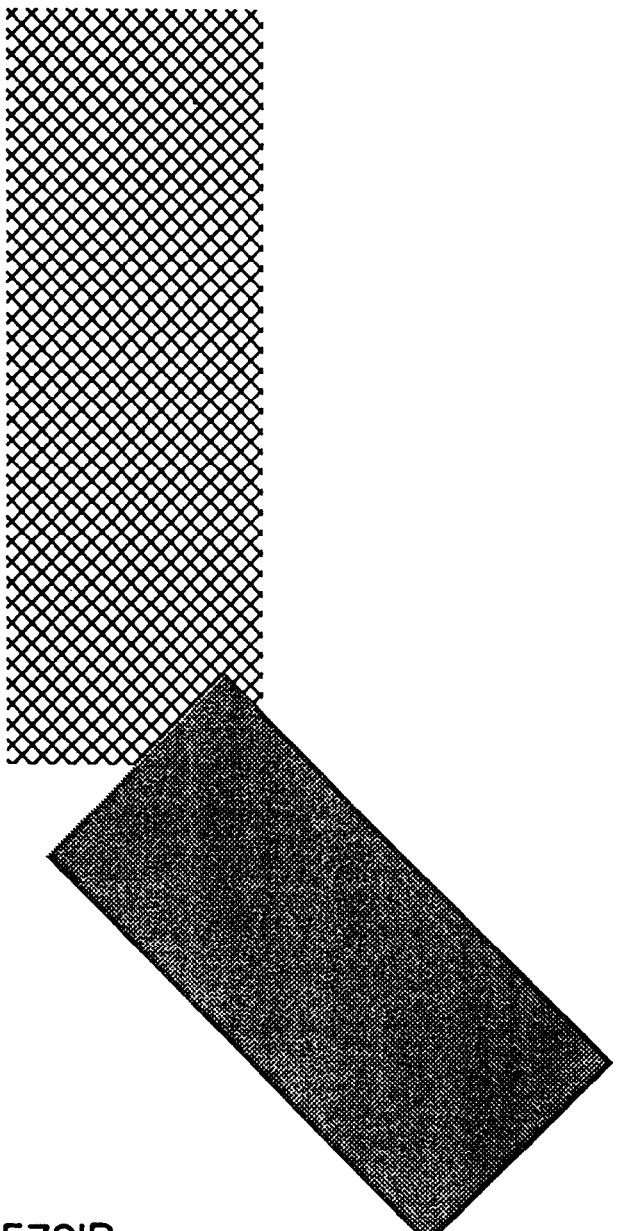
FIG. 23 is a diagram showing into which object a diagram that is handled in the embodiment is converted.
Figure 23:
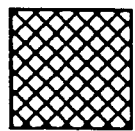
Figure 23:
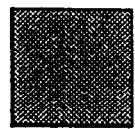

Consequently, the first segment is held as a trapezoid, the second segment is held as a run length object, and they are drawn (FIG. 23).

There is also a method whereby among the segments which satisfy the conditions in which the trapezoid processing can be performed, the segments whose slopes are horizontal or vertical are converted into box objects in which an amount of data is smaller than that of the trapezoid. The box object relates to a system in which information of the right and left coordinates, width, and height of a diagram is possessed as data.

Figure 24:
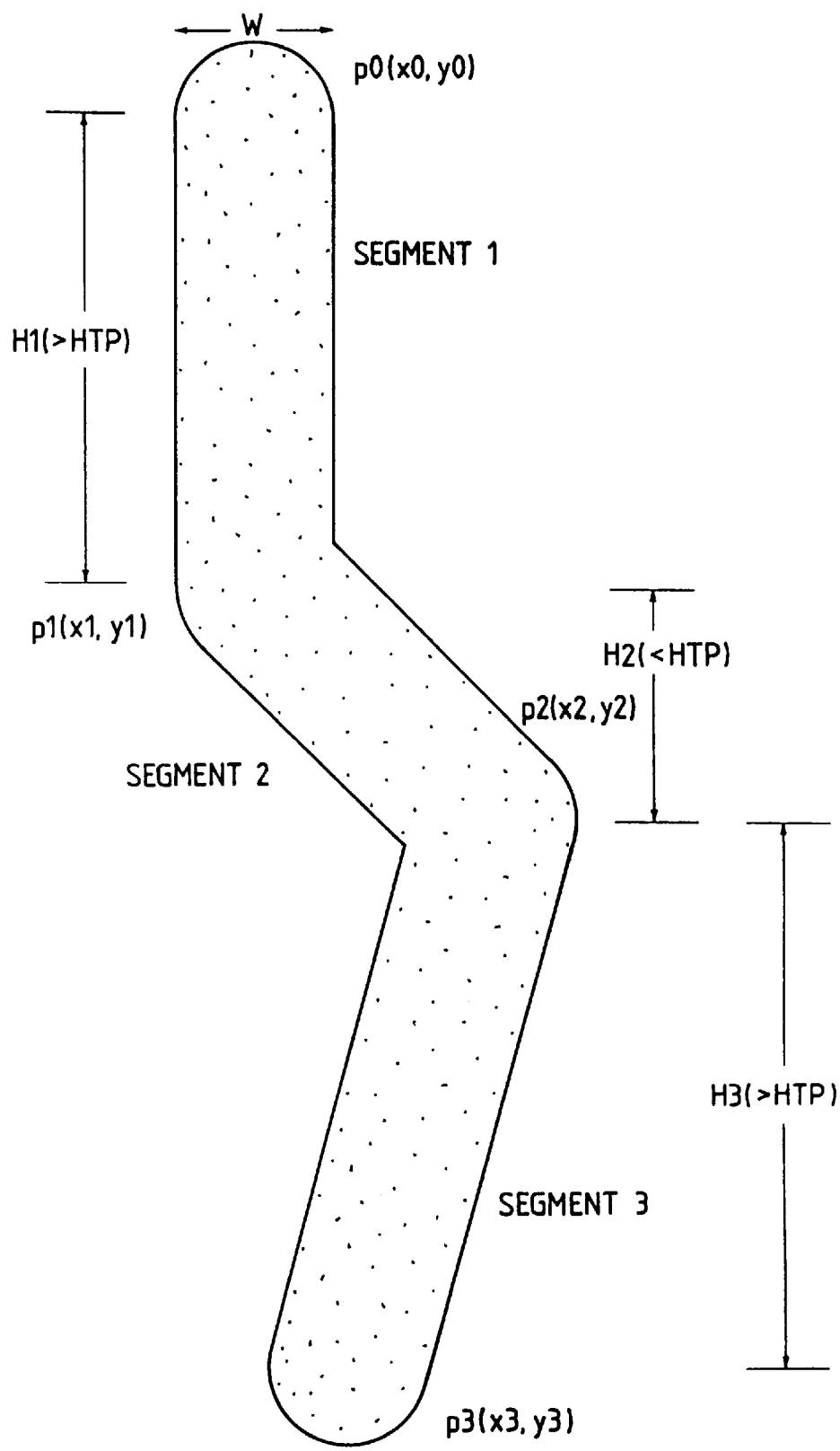
FIG. 24 is a diagram showing diagram data which is handled in another embodiment.

An algorithm for drawing a line consisting of three segments will now be shown as an embodiment hereinbelow. In FIG. 24, a start position of the line to be drawn is set to p0, a start position of the second segment is set to p1, a start position of the third segment is set to p2, and an end position of the line is set to p3. The line has dimensions such that a line width is set to W, a height and a slope of the first segment are respectively set to H1 and S1 (=0°) (vertical), a height and a slope of the second segment are respectively set to H2 and S2 (=45°), and a height and a slope of the third segment are respectively set to H3 and S3 (=60°). A round processing is performed to the connecting portions of the initial and final line ends and the segments. It is now assumed that the trapezoid processing effective reference height calculated by the drawing processing function or the like is equal to HTP. In the algorithm shown in FIG. 19, a dot train p (0–2) of the line and the number of segments (=3) have previously been given.

After the start of the drawing, the number of the current segment which is at present being processed is initialized in S191. In S192, the start position of the line is set to the position (SgC) of the current segment. In S193, the segment number is increased by "1" and is set to n=1. In S194, the position (SgN) of the next segment to be processed next is set. The height HT(1) of the current (initial) segment is obtained on the basis of the y coordinates of the set positions SgC and SgN (S195).

In S196, HT(1) and the trapezoid processing effective reference height HTP are compared. Since HT1 is larger than HTP, the trapezoid processing is effective. Further, a step of discriminating whether the box processing is effective is added. As a result of this judgment, since S1=0° and the slope is vertical, it is judged that the box processing is effective. The processing routine advances to S197. When it is judged that the box processing is ineffective, the trapezoid processing is executed as shown in the foregoing embodiment. Since the segment number is equal to 1 here, the current segment is the initial segment and the processing routine is shifted to S198. Since the initial line processing is the round processing, S199 follows and the line end portion is run length processed on the basis of SgC and the line width W. Thus, the line end portion of the segment becomes the run length and the other portions become the boxes.

Four top, bottom, right, and left coordinate values which are necessary for the box processing are obtained in S1910 and S1911. The stroke portion excluding the line end is box processed on the basis of those four coordinate values and the line width W (S1912).

After that, since n≠3 (the number of segments) in S1914, the processing routine advances to step S1915 for the connecting portion. Since the connection processing is the round processing here, the processing routine advances to S1916 and the connecting portion is run length processed on the basis of SgN and W. In 51917, the next segment is replaced to the current segment. The processing routine is returned to S193.

After the processes were subsequently similarly executed by setting n=2 in S193, since HT2<HTP in S196, it is judged that the trapezoid processing is ineffective. In S1913, the entire segment is run length processed.

In S1914, since n≠3, S1915 follows and the connecting portion is similarly run length processed. In S1917, the next segment is replaced to the current segment. The processing routine is returned to S193.

After the processes were again similarly executed by setting n=3 in S193, since HT3>HTP in S196, it is judged that the trapezoid processing is effective. In S197 to S1912, the segment excluding the connecting portion is trapezoid processed.

In final step S1914, since the segment number is equal to 3, it is judged that the current segment is the final segment, and S1918 follows (step S191). Since the final line edge is round processed, the line edge portion is run length processed on the basis of SgC and W. The processing routine is finished.

Figure 25:
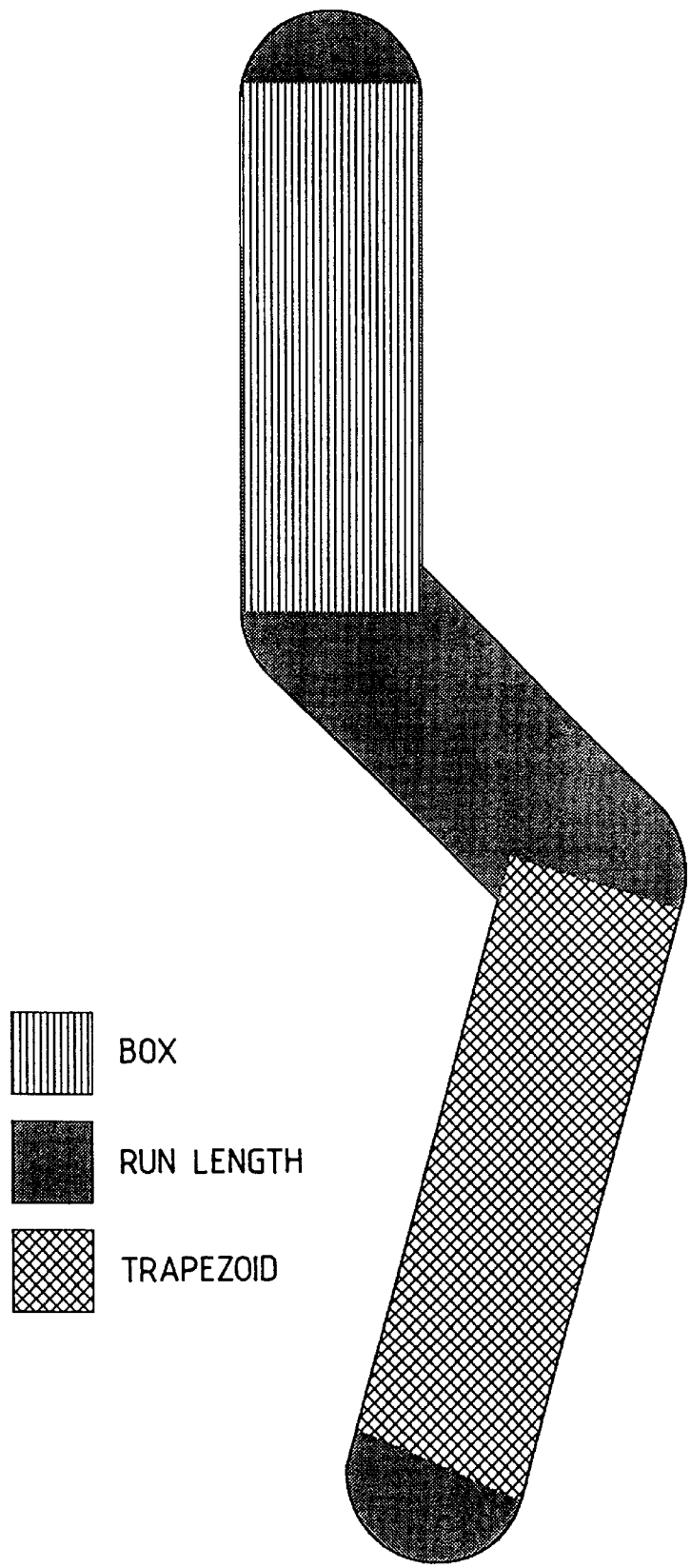
FIG. 25 is a diagram showing into which object a diagram that is handled in another embodiment is converted.
Figure 26:
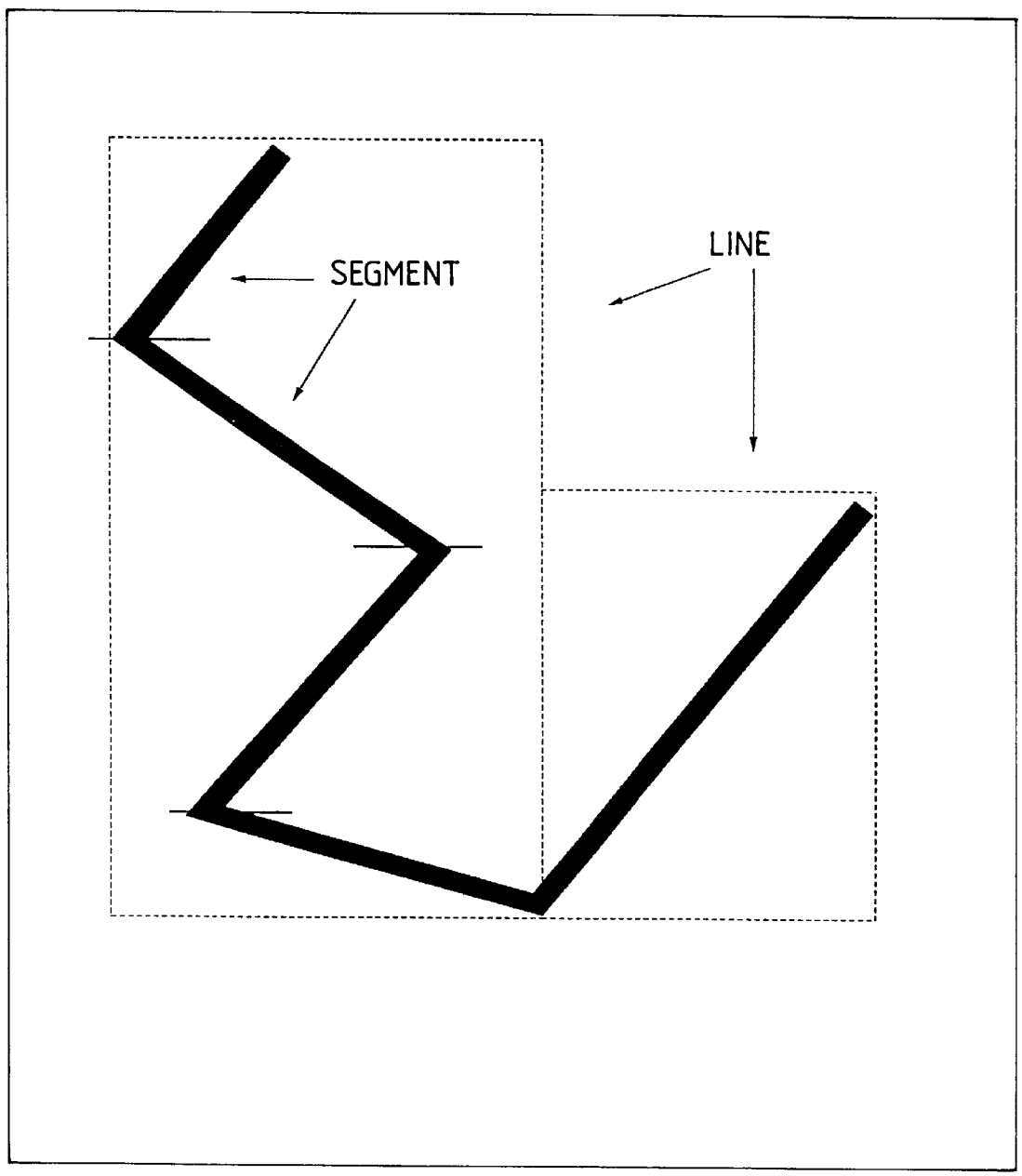
FIG. 26 is a diagram showing a processing unit of a diagram to be drawn in one page.

Thus, the first segment is drawn as a box object, the second segment, line ends, and connecting portions are drawn as run length objects, and the third segment are drawn as a trapezoid object (FIG. 25).

The invention can be applied to a system constructed by a plurality of apparatuses or can be also applied to an apparatus comprising one equipment. The invention can be also applied to a case where it is embodied by supplying a program to a system or an apparatus. In this case, a memory medium in which the programs according to the invention have been stored constructs the invention. By reading out the programs from the memory medium and supplying to the system or apparatus, the system or apparatus functions in a special form.

According to the embodiments as described above, for a lack of memory capacity or a low speed which is caused when an amount of line data per page is increased due to the realization of a high resolution of the printer, an enlargement in paper size, or the like, by selecting the optimum data format corresponding to the shape and size of the object, the drawing can be more efficiently performed.

What is claimed is:

1. A drawing processing apparatus comprising:

discriminating means for discriminating whether pen step data of a designated line width has been stored in memory means or not;

recognizing means for recognizing a vacant capacity of said memory means in the case where it is judged by said discriminating means that said pen step data of the designated line width is not stored in said memory means;

discriminating means for discriminating whether the pen step data of the designated line width can be stored into said memory means or not on the basis of the recognition by said recognizing means;

deleting means for deleting the pen step data stored in said memory means corresponding to an amount such that the pen step data of the designated line width can be stored in the case where it is judged by said discriminating means that the pen step data of the designated line width cannot be stored into said memory means; and means for storing the pen step data of the designated line width into said memory means after said pen step data was deleted by said deleting means.

2. An apparatus according to claim 1, further having:

drawing means for drawing the diagram on the basis of the pen step data stored in said memory means; and output means for outputting the diagram drawn by said drawing means.

3. An apparatus according to claim 2, wherein said output means is a printer or a display.

4. An apparatus according to claim 1, further having:

second discriminating means for discriminating whether compressed poly pen data of the designated line width has been stored in compressed data memory means or not;

forming means for forming poly pen data in the case where it is judged by said second discriminating means that the compressed poly pen data of the designated line width is not stored in said compressed data memory means;

compressing means for compressing the poly pen data formed by said forming means; and making means for making pen step data on the basis of the poly pen data compressed by said compressing means.

5. A diagram processing method comprising:

a discriminating step of discriminating whether pen step data of a designated line width has been stored in memory means or not;

a recognizing step of recognizing a vacant capacity of said memory means in the case where it is judged by said discriminating step that the pen step data of the designated line width is not stored in said memory means;

a discriminating step of discriminating whether the pen step data of the designated line width can be stored into said memory means or not on the basis of the recognition by said recognizing step;

a deleting step of deleting the pen step data stored in said memory means corresponding to an amount such that the pen step data of the designated line width can be stored in the case where it is judged by said discriminating step that the pen step data of the designated line width cannot be stored into said memory means; and a memory step of storing the pen step data of the designated line width into said memory means after the pen step data was deleted by said deleting step.

6. A method according to claim 5, further having:

a drawing step of drawing a diagram on the basis of the pen step data stored in said memory means; and output step of outputting the diagram drawn by said drawing step to output means.

7. A method according to claim 6, wherein said output means is a printer or a display.

8. A method according to claim 5, further having:

a second discriminating step of discriminating whether compressed poly pen data of the designated line width has been stored in compressed data memory means or not;

forming step of forming poly pen data in the case where it is judged by said second discriminating step that the compressed poly pen data of the designated line width is not stored in said compressed data memory means;

a compressing step of compressing the poly pen data formed by said forming step; and a making step of making pen step data on the basis of the poly pen data compressed by said compressing step.

9. A diagram processing apparatus for holding diagram data in a run length format and a trapezoid format and drawing bit map data indicative of a diagram on the basis of the diagram data, comprising:

input means for inputting the diagram data;

discriminating means for discriminating whether the diagram data inputted by said input means satisfies a predetermined condition; and means for holding the diagram data by the trapezoid format when it is judged by said discriminating means that the diagram data satisfies the predetermined condition, and for holding the diagram data by the run length format when it is judged by said discriminating means that the diagram data does not satisfy the predetermined condition.

10. An apparatus according to claim 9, further having drawing means for drawing the bit map data indicative of the diagram on the basis of the diagram data held by said run length format and said trapezoid format.

11. An apparatus according to claim 10, further having output means for outputting the bit map data drawn by said drawing means.

12. An apparatus according to claim 11, wherein said output means is a printer.

13. An apparatus according to claim 9, wherein said predetermined condition is such that a height of the diagram is equal to or higher than a specific value.

14. An apparatus according to claim 9, wherein said predetermined condition is such that the diagram shown by the diagram data is not a joint portion or an edge portion of the diagram.

15. An apparatus according to claim 9, wherein said figure data includes data of a box format.

16. An apparatus according to claim 9, wherein said run length format is a format in which a drawing start point and a drawing end point of every scan line are held, and said trapezoid format is a format in which a deviation of an X coordinate of each summit, a slope, and the number of scan lines with respect to an outline are held.

17. An apparatus according to claim 9, wherein the diagram data is line diagram data.

18. An apparatus according to claim 17, wherein said line diagram data is divided line diagram data.

19. A diagram processing method of holding diagram data by a run length format and a trapezoid format and drawing bit map data indicative of a diagram on the basis of the diagram data, comprising:

inputting the diagram data;

discriminating whether the diagram data inputted in said input step satisfies a predetermined condition; and holding the diagram data by the trapezoid format when it is judged in said discriminating step that the diagram data satisfies the predetermined condition and holding the diagram data by the run length format when it is judged in said discriminating step that the diagram data does not satisfy the predetermined condition.

20. A method according to claim 19, further having a drawing step of drawing the bit map data indicative of the diagram on the basis of the diagram data held by said run length format and said trapezoid format.

21. A method according to claim 20, further having an output step of outputting the bit map data drawn by said drawing step to output means.

22. A method according to claim 21, wherein said output means is a printer.

23. A method according to claim 19, wherein said predetermined condition is such that a height of the diagram is equal to or higher than a specific value.

24. A method according to claim 19, wherein said predetermined condition is such that the diagram shown by the diagram data is not a joint portion or an edge portion of the diagram.

25. A method according to claim 19, wherein said figure data includes data of a box format.

26. A method according to claim 19, wherein said run length format is a format in which a drawing start point and a drawing end point of every scan line are held, and said trapezoid format is a format in which a deviation of an X coordinate of each summit, a slope, and the number of scan lines with respect to an outline are held.

27. A method according to claim 19, wherein the diagram data is line diagram data.

28. A method according to claim 27, wherein said line diagram data is divided line diagram data.

* * * * *